US009065060B2

(12) United States Patent
Hong et al.

(10) Patent No.: US 9,065,060 B2
(45) Date of Patent: Jun. 23, 2015

(54) COMPOUND AND ORGANIC LIGHT-EMITTING DEVICE COMPRISING SAME

(75) Inventors: Sung Kil Hong, Daejeon (KR); Yun Hwan Kim, Seoul (KR); Tae Yoon Park, Daejeon (KR); Hye Young Jang, Daejeon (KR); Boonjae Jang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/979,956

(22) PCT Filed: Jan. 17, 2012

(86) PCT No.: PCT/KR2012/000396
§ 371 (c)(1),
(2), (4) Date: Sep. 9, 2013

(87) PCT Pub. No.: WO2012/099376
PCT Pub. Date: Jul. 26, 2012

(65) Prior Publication Data
US 2013/0334517 A1 Dec. 19, 2013

(30) Foreign Application Priority Data
Jan. 17, 2011 (KR) .................. 10-2011-0004715

(51) Int. Cl.
H01L 51/54 (2006.01)
C09K 11/06 (2006.01)
H01L 51/00 (2006.01)
H01L 51/50 (2006.01)
H05B 33/14 (2006.01)

(52) U.S. Cl.
CPC .......... *H01L 51/006* (2013.01); *H01L 51/5056* (2013.01); *C09K 11/06* (2013.01); *C09K 2211/1007* (2013.01); *C09K 2211/1011* (2013.01); *C09K 2211/1014* (2013.01); *H05B 33/14* (2013.01); *H01L 51/0051* (2013.01); *H01L 51/0052* (2013.01); *H01L 51/0059* (2013.01); *H01L 51/0061* (2013.01); *H01L 51/0072* (2013.01); *H01L 51/0085* (2013.01); *H01L 51/5016* (2013.01); *H01L 51/0074* (2013.01)

(58) Field of Classification Search
None
See application file for complete search history.

(56) References Cited

U.S. PATENT DOCUMENTS

| | | | |
|---|---|---|---|
| 2007/0029927 A1 | 2/2007 | Kawamura et al. | |
| 2009/0026919 A1* | 1/2009 | Stossel et al. | 313/504 |
| 2009/0230852 A1* | 9/2009 | Lee et al. | 313/504 |

FOREIGN PATENT DOCUMENTS

| | | | |
|---|---|---|---|
| JP | 2000-012229 A | | 1/2000 |
| JP | 2001-332384 A | | 11/2001 |
| JP | 2006-83073 A | | 3/2006 |
| JP | 2006083073 A | * | 3/2006 |
| JP | 2007-314512 A | | 12/2007 |
| JP | 2008-091380 A | | 4/2008 |
| JP | 2008-308467 A | | 12/2008 |
| JP | 2009-215333 A | | 9/2009 |
| JP | 2013-530513 A | | 7/2013 |
| KR | 10-2008-0034137 A | | 4/2008 |
| KR | 10-2010-0048210 A | | 5/2010 |
| KR | 10-2011-0047803 A | | 5/2011 |
| WO | 2011/136484 A1 | | 11/2011 |

OTHER PUBLICATIONS

Machine translation of JP2006-083073. Date of publication: Mar. 30, 2006.*
Proceedings of SPIE—The International Society for Optical Engineering, Organic Light Emitting Materials and Devices III, 1999, 3797, 58-65. Year of publication: 1999.*
Machine translation of JP2000-012229. Date of publication: Jan. 14, 2000.*

* cited by examiner

*Primary Examiner* — Andrew K Bohaty
(74) *Attorney, Agent, or Firm* — McKenna Long & Aldridge, LLP

(57) ABSTRACT

The present invention relates to a novel compound and an organic light emitting device comprising the same. The compound according to the present invention may be used as hole injection, hole transport, electron injection and transport, and light emitting materials in an organic light emitting device, and the organic light emitting device according to the present invention has excellent properties in terms of efficiency, driving voltage, and life-span.

16 Claims, 1 Drawing Sheet

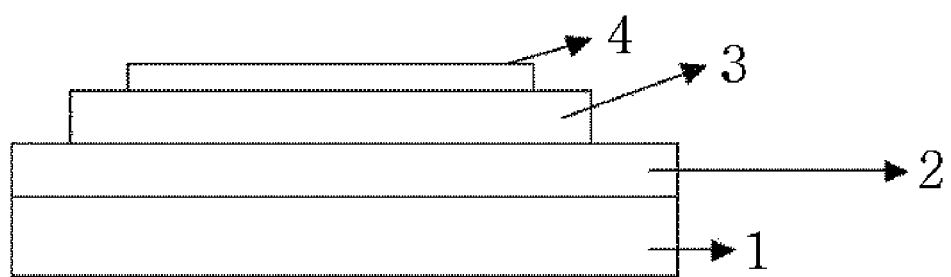

COMPOUND AND ORGANIC LIGHT-EMITTING DEVICE COMPRISING SAME

This application is a national stage entry of International Application No. PCT/KR2012/000396, filed on Jan. 17, 2012, which claims priority to Korean Patent Application No. 10-2011-0004715, filed on Jan. 17, 2011 with the Korean Patent Office, all of which are incorporated herein in their entirety by reference.

TECHNICAL FIELD

The present invention relates to a novel compound that is capable of largely improving a life span, efficiency, electrochemical stability, and thermal stability of an organic light emitting device, and an organic light emitting device comprising the same.

BACKGROUND ART

An organic light emitting phenomenon is an example of a conversion of current into visible rays by an internal process of a specific organic molecule. The organic light emitting phenomenon is based on the following principle. When an organic material layer is interposed between an anode and a cathode, if voltage is applied between two electrodes, electrons and holes are injected from the cathode and the anode to the organic material layer. The electrons and the holes injected into the organic material layer are recombined to form an exciton, and the exciton is fallen again to a bottom state to emit light. The organic light emitting device using the principle may be generally constituted by a cathode, an anode, and an organic material layer interposed therebetween, for example, an organic material layer comprising a hole injection layer, a hole transport layer, a light emitting layer, and an electron transport layer.

The materials used in the organic light emitting device are mostly pure organic materials or complexes of organic material and metal, and may be classified into a hole injection material, a hole transport material, a light emitting material, an electron transport material, an electron injection material, and the like according to its use. Herein, an organic material having a p-type property, that is, an organic material easily oxidized and electrochemically stable when the organic material is oxidized, is mainly used as the hole injection material or the hole transport material. Meanwhile, an organic material having an n-type property, that is, an organic material easily reduced and electrochemically stable when the organic material is reduced, is mainly used as the electron injection material or the electron transport material. A material having both p-type and n-type properties, that is, a material that is stable when the material is oxidized and reduced, is preferable as the light emitting layer material, and a material having high light emitting efficiency for conversion of the exciton into light when the exciton is formed is preferable.

In addition to the aforementioned matter, it is preferable that the material used in the organic light emitting device further have the following properties.

First, it is preferable that the material used in the organic light emitting device have excellent thermal stability. The reason is because joule heat is generated by movement of electric charges in the organic light emitting device. NPB, which has recently been used as the hole transport layer material, has a glass transition temperature of 100° C. or lower, and thus there is a problem in that NPB is difficult to be used in an organic light emitting device requiring a high current.

Second, holes or electrons injected into the organic light emitting device should be smoothly transported to the light emitting layer, and the injected holes and electrons should not be discharged to the outside of the light emitting layer in order to obtain a high efficiency organic light emitting device that can be driven at a low voltage. To this end, a material used in the organic light emitting device should have an appropriate band gap and HOMO or LUMO energy level. In the case of PEDOT:PSS currently used as a hole transport material in an organic light emitting device manufactured by a solution coating method, since a LUMO energy level thereof is lower than that of an organic material used as a light emitting layer material, it is difficult to manufacture an organic light emitting device having high efficiency and a long life span.

In addition, the material used in the organic light emitting device should have excellent chemical stability, electric charge mobility, and interfacial characteristic with an electrode or an adjacent layer. That is, the material used in the organic light emitting device should be little deformed by moisture or oxygen. Further, appropriate hole or electron mobility should be ensured so as to balance densities of the holes and of the electrons in the light emitting layer of the organic light emitting device, thus maximizing formation of excitons. Additionally, a preferable interface with an electrode including metal or metal oxides should be ensured for stability of the device.

Accordingly, there is a need to develop an organic material having the aforementioned requirements in the art.

DISCLOSURE

Technical Problem

The present inventors aim to provide a novel compound which can satisfy conditions required in a material capable of being used in an organic light emitting device, for example, an appropriate energy level, electrochemical stability, thermal stability, and the like, and has a chemical structure capable of performing various roles required in the organic light emitting device according to a substituent group, and an organic light emitting device including the same.

Technical Solution

An exemplary embodiment of the present invention provides a compound represented by the following Chemical Formula 1.

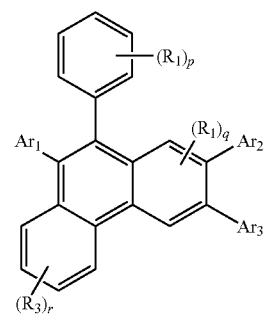

[Chemical Formula 1]

In Chemical Formula 1, $Ar_1$ to $Ar_3$ are the same as or different from each other, and are each independently selected from the group consisting of hydrogen; an alkyl group substituted or unsubstituted by one or more substituent groups selected from the group consisting of a halogen group, an alkyl group, an alkenyl group, an alkoxy group, a cycloalkyl group, an aryl group, an arylalkyl group, an arylalkenyl group, a heterocyclic group, a nitrile group, and an acetylene group; an alkoxy group substituted or unsubstituted by one or more substituent groups selected from the group consisting of a halogen group, an alkyl group, an alkenyl group, an alkoxy group, a cycloalkyl group, an aryl group, an arylalkyl group, an arylalkenyl group, a heterocyclic group, a nitrile group, and an acetylene group; an aryl group substituted or unsubstituted by one or more substituent groups selected from the group consisting of a halogen group, an alkyl group, an alkenyl group, an alkoxy group, a cycloalkyl group, an aryl group, an arylalkyl group, an arylalkenyl group, a heterocyclic group, a nitrile group, an acetylene group, and an arylamine group; a heterocyclic group substituted or unsubstituted by one or more substituent groups selected from the group consisting of a halogen group, an alkyl group, an alkenyl group, an alkoxy group, a cycloalkyl group, an aryl group, an arylalkyl group, an arylalkenyl group, a heterocyclic group, a nitrile group, and an acetylene group; and an amine group substituted or unsubstituted by one or more substituent groups selected from the group consisting of an alkyl group, an alkenyl group, an aryl group, an arylalkyl group, an arylalkenyl group, and a heterocyclic group, at least one of $Ar_2$ and $Ar_3$ is an amine group substituted or unsubstituted by an aryl group, a heterocyclic group, or a fluorenyl group; or an aryl group substituted by an amine group substituted or unsubstituted by an aryl group, a heterocyclic group, or a fluorenyl group, and may be further substituted by an aryl group, a fluorene group, or an arylamine group, $R_1$, $R_2$ and $R_3$ are the same as or different from each other, and are each independently selected from the group consisting of hydrogen; a halogen group; an alkyl group; an alkenyl group; an alkoxy group; an aryl group; a heterocyclic group; and an amine group substituted or unsubstituted by an alkyl group, an aryl group, or a heterocyclic group, and p is an integer of 1 to 5, q is an integer of 1 or 2, and r is an integer of 1 to 4.

Another exemplary embodiment of the present invention provides an organic light emitting device including a first electrode, a second electrode, and one or more organic material layers disposed between the first electrode and the second electrode, in which one or more layers of the organic material layers include the compound represented by Chemical Formula 1.

Advantageous Effects

According to the exemplary embodiments of the present invention, a novel compound may be used as an organic material layer material of an organic light emitting device. In the case where the compound represented by Chemical Formula 1 according to the present invention is used in the organic light emitting device, it is possible to reduce a driving voltage of the device, improve light efficiency, and improve a life span property of the device by thermal stability of the compound.

BRIEF DESCRIPTION OF THE DRAWINGS

FIG. 1 illustrates an example of an organic light emitting device formed of a substrate 1, an anode 2, a light emitting layer 3, and a cathode 4.

BEST MODE

Hereinafter, the present invention will be described in more detail.

A novel compound according to the present invention is represented by Chemical Formula 1.

In the compound according to the present invention, substituent groups of Chemical Formula 1 will be described in more detail below.

Examples of a halogen group may include fluorine, chlorine, bromine, iodine and the like, but are not limited thereto.

An alkyl group may be a straight or branched chain, and the number of carbon atoms is not particularly limited but is preferably 1 to 6. Specific examples thereof include a methyl group, an ethyl group, a propyl group, an isopropyl group, a butyl group, a t-butyl group, a pentyl group, a hexyl group, and the like, but are not limited thereto.

An alkenyl group may be a straight or branched chain, and the number of carbon atoms is not particularly limited but is preferably 2 to 6.

It is preferable that a cycloalkyl group have the 3 to 12 carbon atoms and do not provide steric hindrance. Specific examples thereof include a cyclopentyl group, a cyclohexyl group, and the like, but are not limited thereto.

It is preferable that an alkoxy group have 1 to 6 carbon atoms, and more specific examples thereof may include methoxy, ethoxy, isopropyloxy, and the like, but are not limited thereto.

An aryl group may be a monocycle or a polycycle, and the number of carbon atoms is not particularly limited but is preferably 6 to 20. Examples of the monocyclic aryl group may include a phenyl group, a biphenyl group, a terphenyl group, stilben, and the like, and examples of the polycyclic aryl group may include a naphthyl group, an anthracenyl group, a phenanthrenyl group, a pyrenyl group, a perylenyl group, a chrysenyl group, and the like, but are not limited thereto.

A heterocyclic group is a heteroatom and a cyclic group including O, N, S, or P, and the number of carbon atoms is not particularly limited but is preferably 2 to 20. Examples of the heterocyclic group include a carbazole group, a thiophene group, a furan group, a pyrrole group, an imidazole group, a thiazole group, an oxazole group, an oxadiazole group, a triazole group, a pyridyl group, a pyradazine group, a quinolynyl group, an isoquinolynyl group, an acrydyl group, and the like, and the compounds such as the following Structural Formulas are preferable, but the examples are not limited thereto.

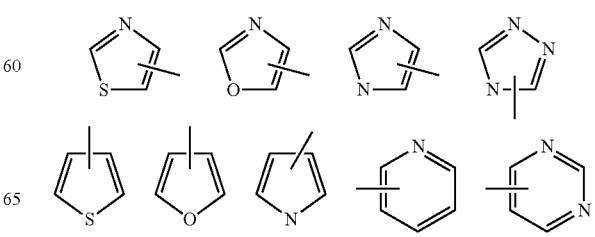

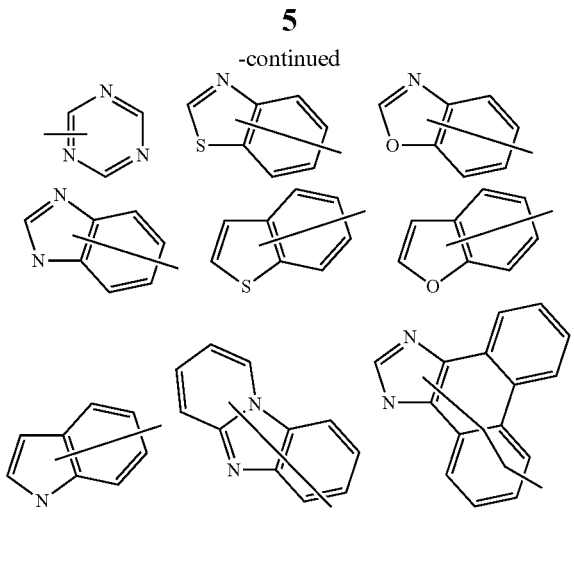

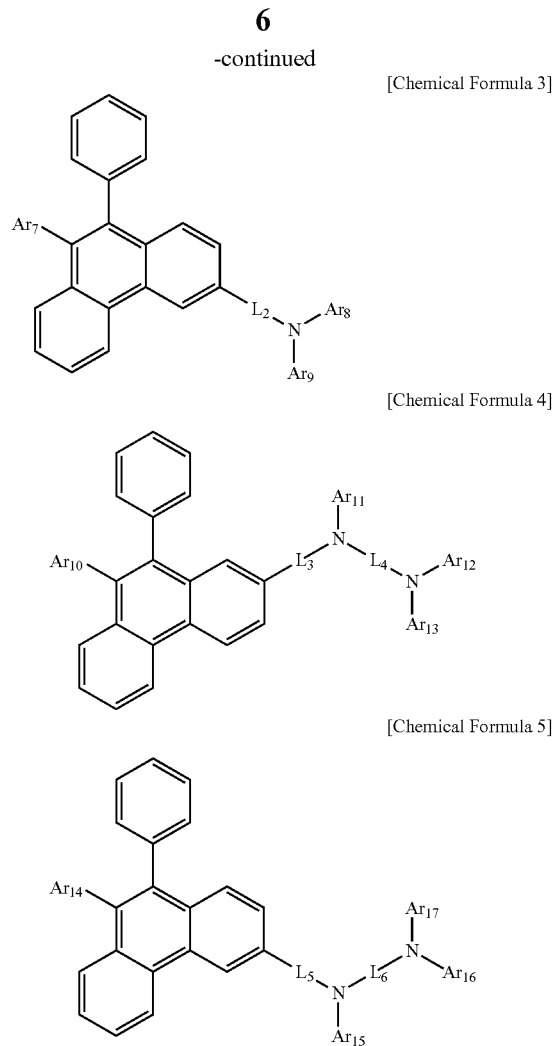

It is preferable that an amine group have 1 to 30 carbon atoms, and more specific examples thereof may include a methylamine group, a dimethylamine group, an ethylamine group, a diethylamine group, a phenylamine group, a naphthylamine group, a biphenylamine group, an anthracenylamine group, a 3-methyl-phenylamine group, a 4-methyl-naphthylamine group, a 2-methyl-biphenylamine group, a 9-methyl-anthracenylamine group, a diphenylamine group, a phenylnaphthylamine group, a ditolylamine group, a phenyltolylamine group, a triphenylamine group, and the like, but are not limited thereto.

The compound represented by Chemical Formula 1 may be preferably a compound represented by the following Chemical Formulas 2 to 5.

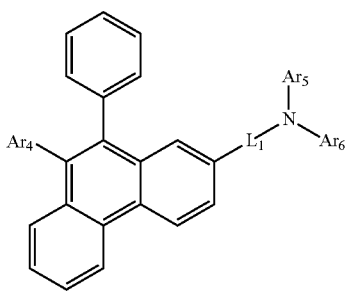

In Chemical Formulas 2 to 5, $Ar_4$, $Ar_7$, $Ar_{10}$, and $Ar_{14}$ are each independently selected from the group consisting of hydrogen; an alkyl group substituted or unsubstituted by one or more substituent groups selected from the group consisting of a halogen group, an alkyl group, an alkenyl group, an alkoxy group, a cycloalkyl group, an aryl group, an arylalkyl group, an arylalkenyl group, a heterocyclic group, a nitrile group, and an acetylene group; an alkoxy group substituted or unsubstituted by one or more substituent groups selected from the group consisting of a halogen group, an alkyl group, an alkenyl group, an alkoxy group, a cycloalkyl group, an aryl group, an arylalkyl group, an arylalkenyl group, a heterocyclic group, a nitrile group, and an acetylene group; an aryl group substituted or unsubstituted by one or more substituent groups selected from the group consisting of a halogen group, an alkyl group, an alkenyl group, an alkoxy group, a cycloalkyl group, an aryl group, an arylalkyl group, an arylalkenyl group, a heterocyclic group, a nitrile group, an acetylene group, and an arylamine group; a heterocyclic group substituted or unsubstituted by one or more substituent groups selected from the group consisting of a halogen group, an alkyl group, an alkenyl group, an alkoxy group, a cycloalkyl group, an aryl group, an arylalkyl group, an arylalkenyl group, a heterocyclic group, a nitrile group, and an acetylene group; and an amine group substituted or unsubstituted by one or more substituent groups selected from the group consisting of an alkyl group, an alkenyl group, an aryl group, an arylalkyl group, an arylalkenyl group, and a heterocyclic group, Ar$_5$, Ar$_6$, Ar$_8$, Ar$_9$, Ar$_{11}$, Ar$_{12}$, Ar$_{13}$, Ar$_{15}$, Ar$_{16}$, and Ar$_{17}$ are each independently a substituted or unsubstituted aryl group, a substituted or unsubstituted heterocyclic group, or a substituted or unsubstituted fluorenyl group, L$_1$, L$_2$, L$_3$, and L$_5$ are a direct bond, an arylene group, or a fluorenylene group, and L$_4$ and L$_6$ are an arylene group.

Further, in the present specification, the term "substituted or unsubstituted" means that substitution is performed by one or more substituent groups selected from the group consisting of heavy hydrogen, a halogen group, an alkyl group, an alkenyl group, an alkoxy group, a silyl group, an arylalkenyl group, an aryl group, a heterocyclic group, a carbazole group, an arylamine group, and a fluorenyl group and a nitrile group substituted or unsubstituted by an alkyl group or an aryl group, or there is no substituent group.

Examples of the substituent group that may be further substituted instead of Ar$_1$ to Ar$_{17}$ of Chemical Formulas 1 to 5 may include a halogen group, an alkyl group, an alkenyl group, an alkoxy group, a silyl group, an arylalkenyl group, an aryl group, a heterocyclic group, a carbazole group, an arylamine group, a fluorenyl group substituted or unsubstituted by an alkyl group or an aryl group, a nitrile group, and the like, but are not limited thereto.

In Chemical Formula 1, Ar$_1$ may be hydrogen or a phenyl group.

In Chemical Formula 1, at least one of Ar$_2$ and Ar$_3$ may be an amine group substituted or unsubstituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group.

In Chemical Formula 1, at least one of Ar$_2$ and Ar$_3$ may be a phenyl group substituted by an amine group substituted or unsubstituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group; a biphenyl group substituted by an amine group substituted or unsubstituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group; a fluorenyl group substituted by an amine group substituted or unsubstituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group; or a naphthyl group substituted by an amine group substituted or unsubstituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group.

In another exemplary embodiment, at least one of Ar$_2$ and Ar$_3$ may be a phenyl group substituted by an amine group substituted or unsubstituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group; a biphenyl group substituted by an amine group substituted or unsubstituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group; or a fluorenyl group substituted by an amine group substituted or unsubstituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group.

In Chemical Formula 1, at least one of Ar$_2$ and Ar$_3$ may be the following substituent group.

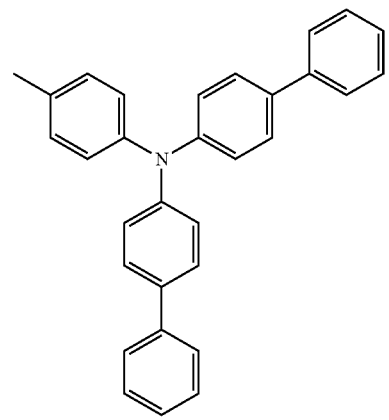

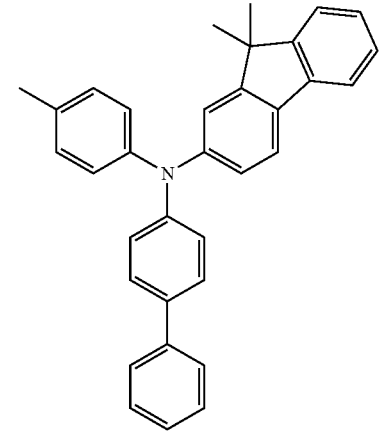

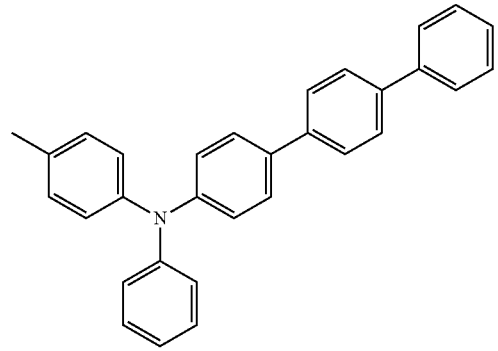

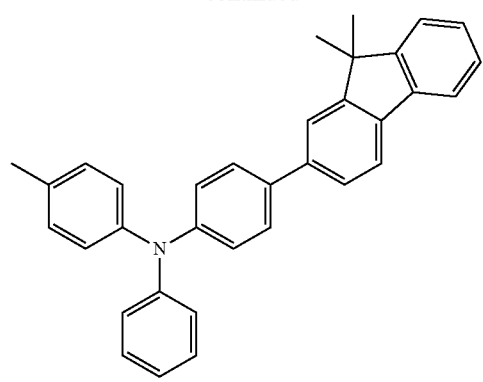
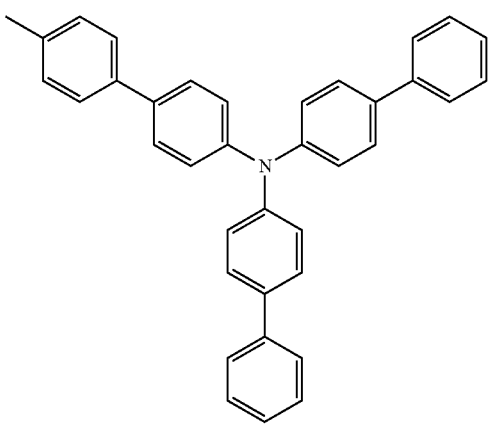
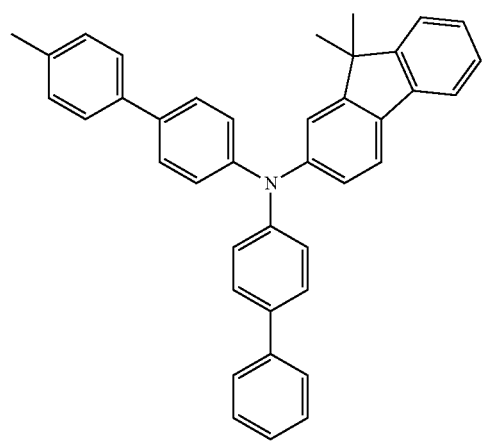
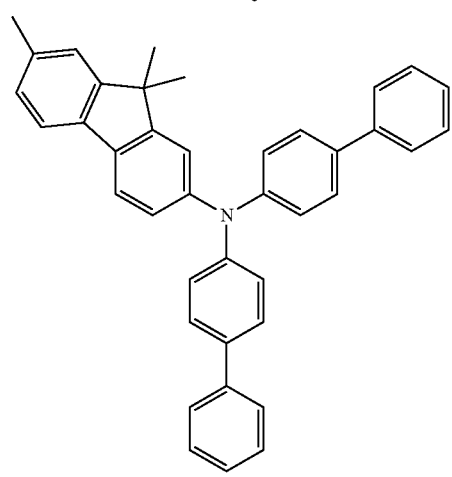
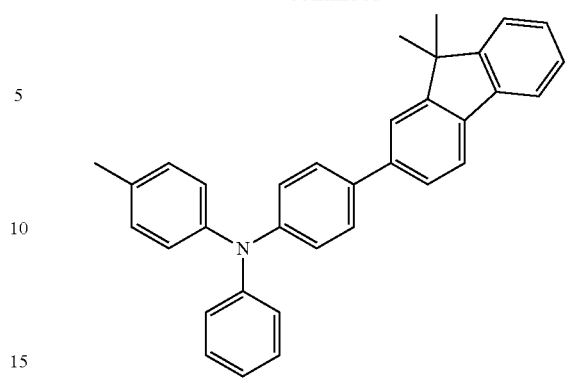
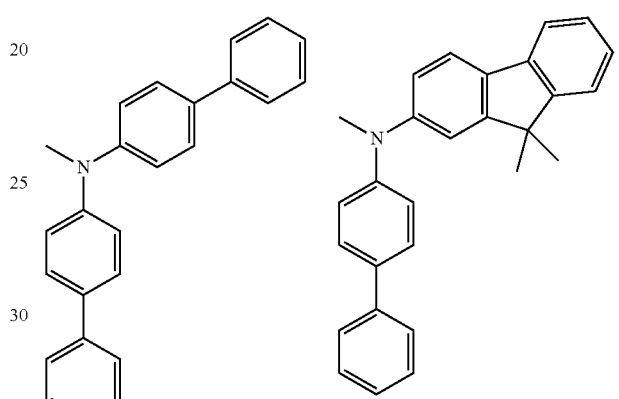
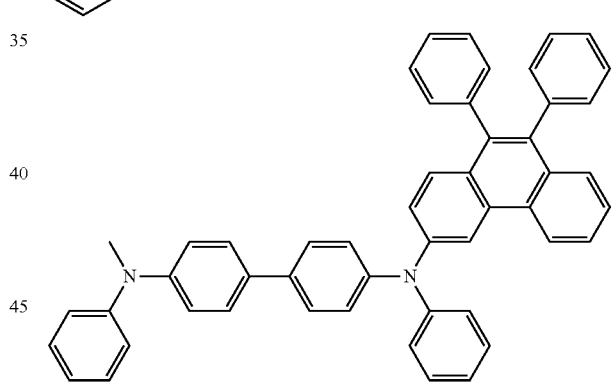
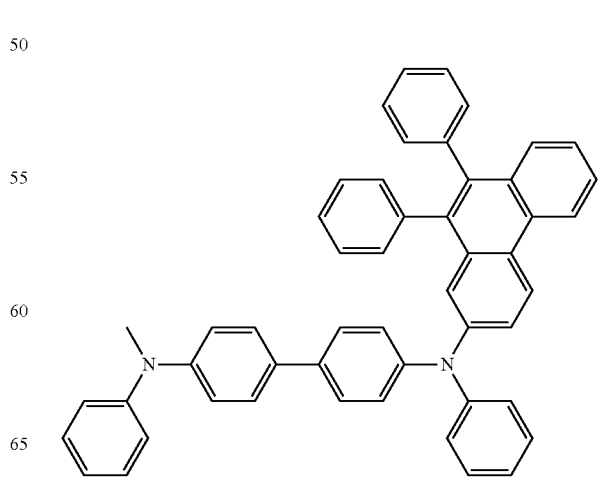

-continued
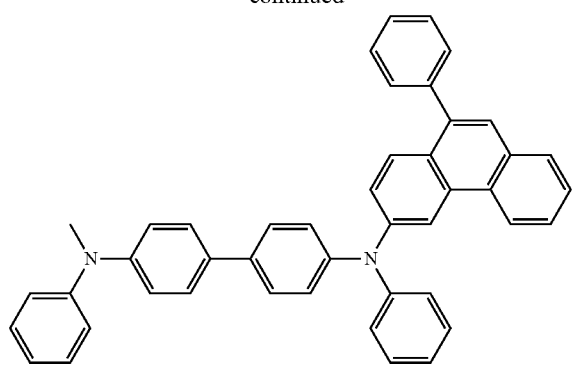
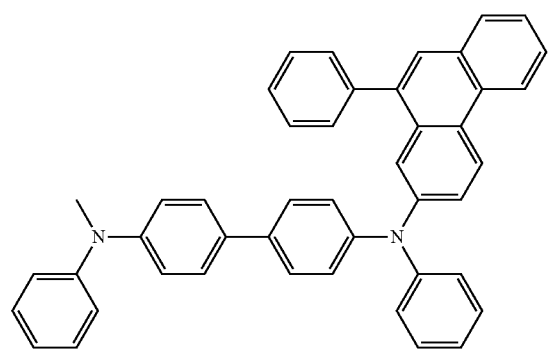
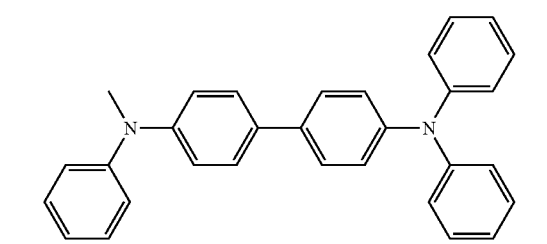
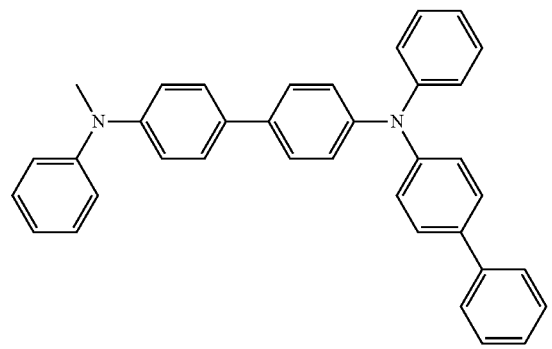
-continued
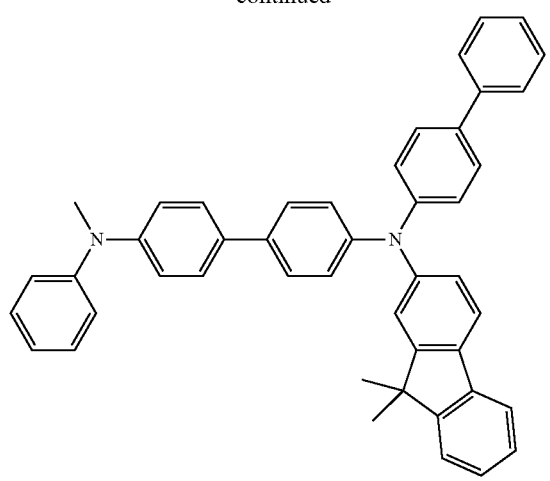
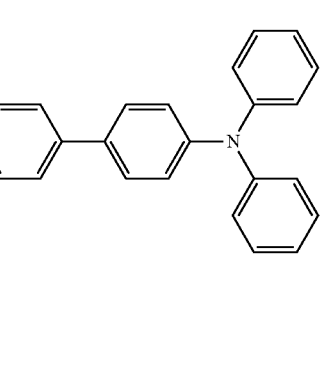
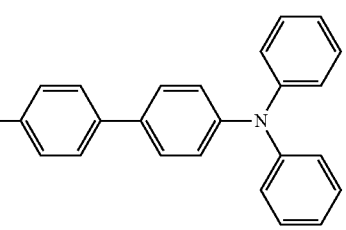
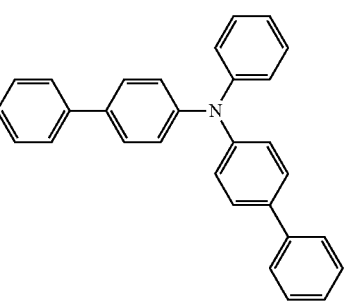

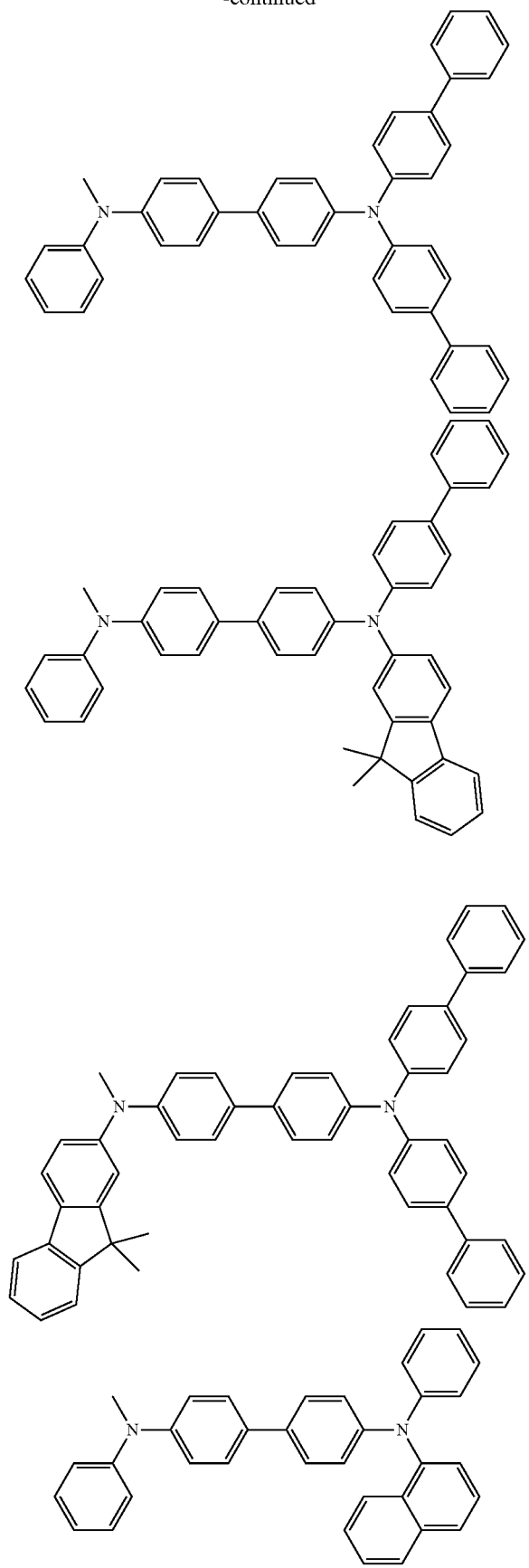
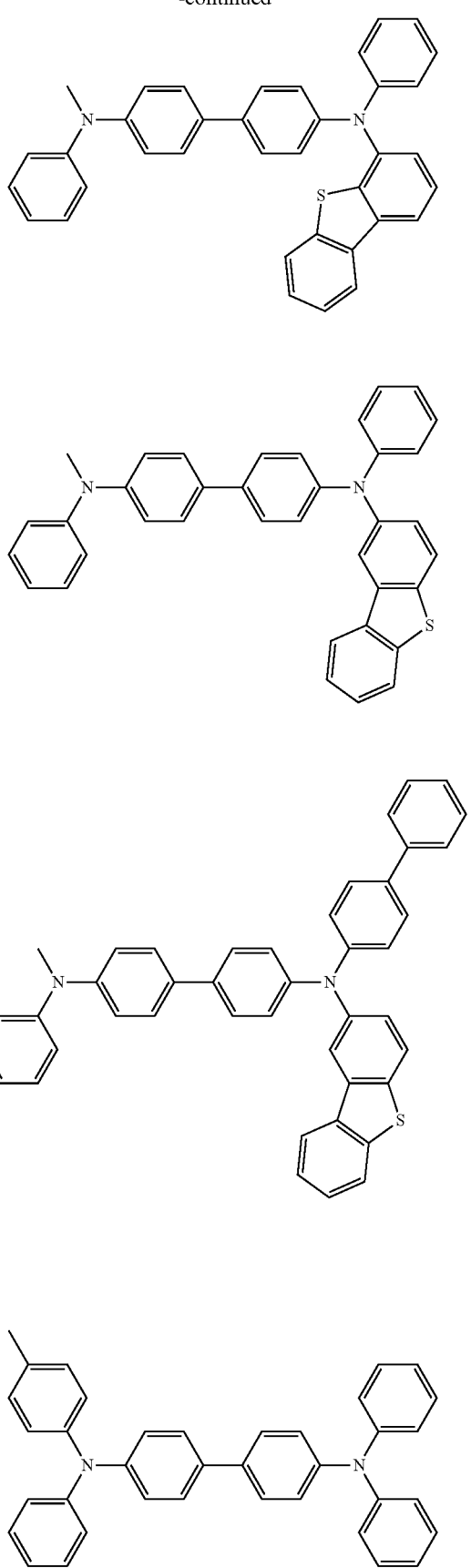

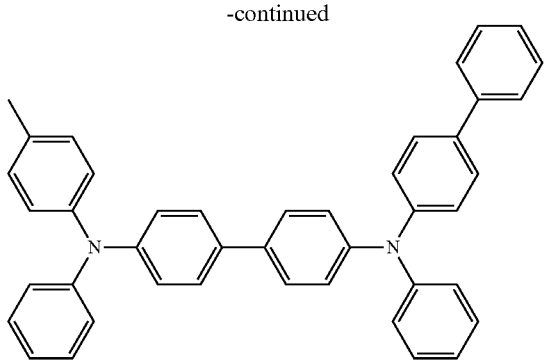

Further, in Chemical Formula 1, when at least one of $Ar_2$ and $Ar_3$ is an amine group substituted or unsubstituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group; at least one of $Ar_2$ and $Ar_3$ is a phenyl group substituted by an amine group substituted or unsubstituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group; at least one of $Ar_2$ and $Ar_3$ is a biphenyl group substituted by an amine group substituted or unsubstituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group; or at least one of $Ar_2$ and $Ar_3$ is a fluorenyl group substituted by an amine group substituted or unsubstituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group, and the other may be hydrogen.

In Chemical Formulas 2 to 5, $Ar_4$, $Ar_7$, $Ar_{10}$, and $Ar_{14}$ may be hydrogen or a phenyl group.

In Chemical Formulas 2 to 5, $Ar_5$, $Ar_6$, $Ar_8$, $Ar_9$, $Ar_{11}$, $Ar_{12}$, $Ar_{13}$, $Ar_{15}$, $Ar_{16}$, and $Ar_{17}$ may be each independently a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group.

In Chemical Formulas 2 to 5, $L_1$, $L_2$, $L_3$, and $L_5$ may be each independently a direct bond, a phenylene group, a biphenylene group, a naphthylene group, or a fluorenylene group.

In another exemplary embodiment, $L_1$, $L_2$, $L_3$, and $L_5$ may be each independently a direct bond, a phenylene group, a biphenylene group, or a fluorenylene group.

In Chemical Formulas 2 to 5, $L_4$ and $L_6$ may be each independently a phenylene group, a biphenylene group, a terphenylene group, or a naphthylene group.

In another exemplary embodiment, $L_4$ and $L_6$ may be each independently a biphenylene group or a terphenylene group.

The compound represented by Chemical Formula 2 or 4 may be manufactured according to the following Reaction Equation 1, and the compound represented by Chemical Formula 3 or 5 may be manufactured according to the following Reaction Equation 2.

[Reaction Equation 1]

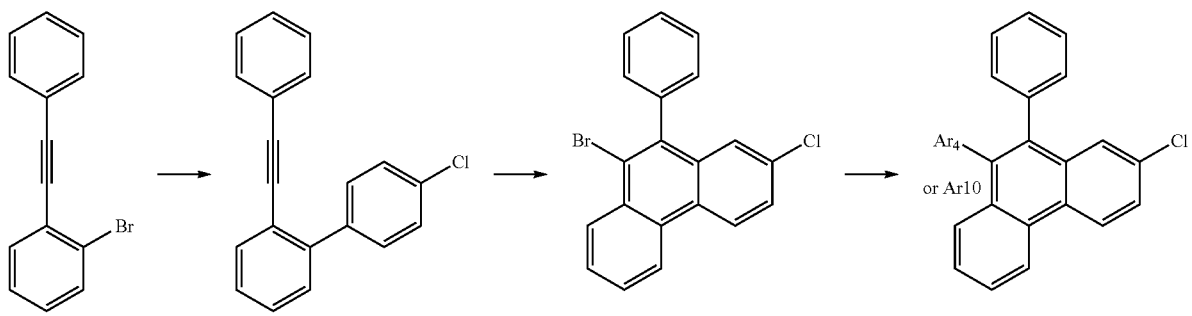

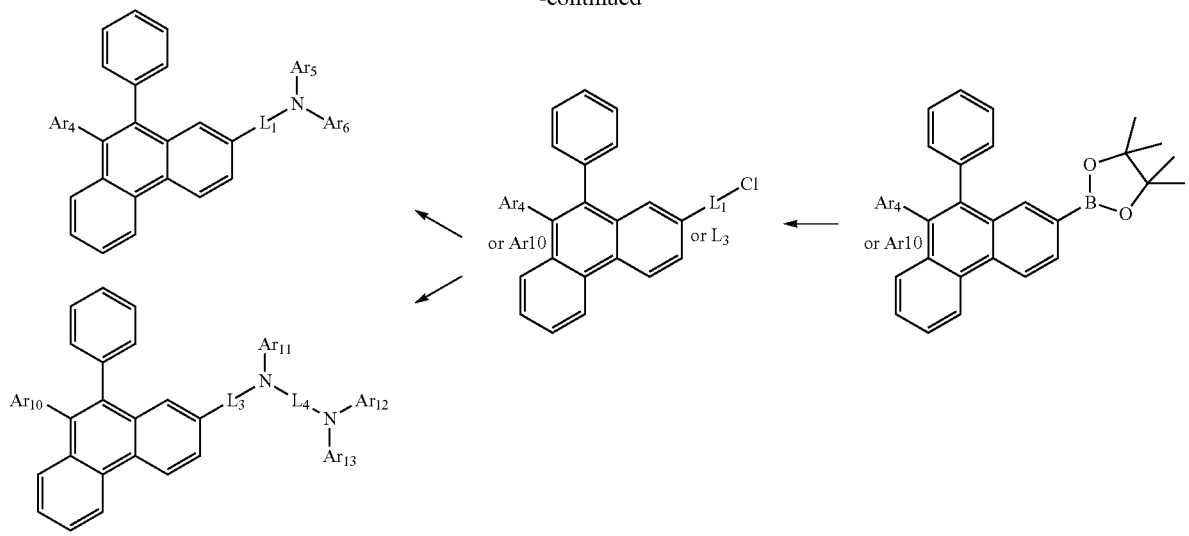
[Reaction Equation 2]
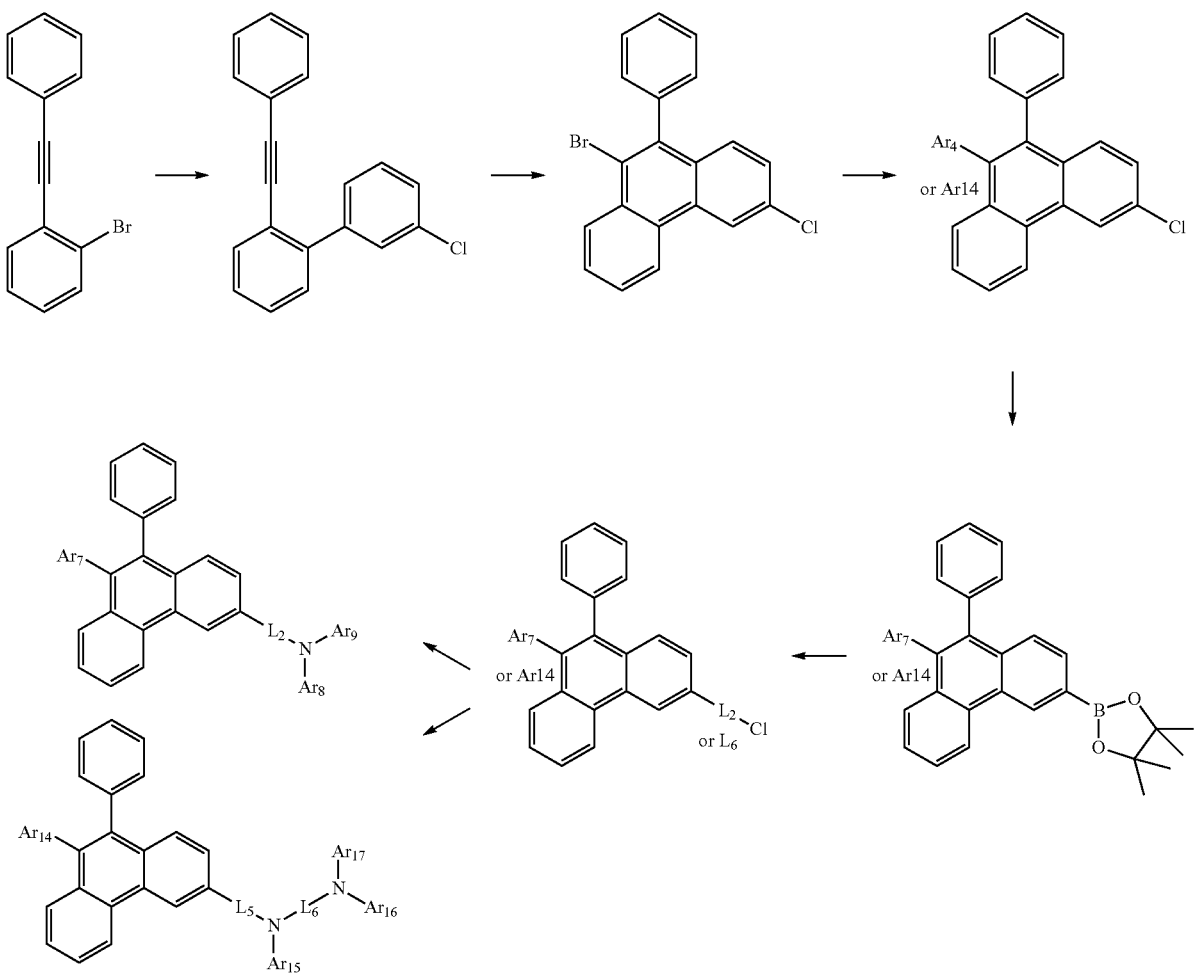

Preferable specific examples of the compound represented by Chemical Formula 1 include the following compounds, but are not limited thereto.
chemical formula 1-1
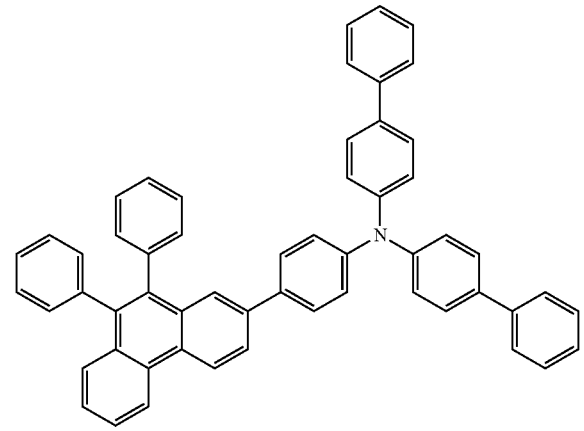
chemical formula 1-2
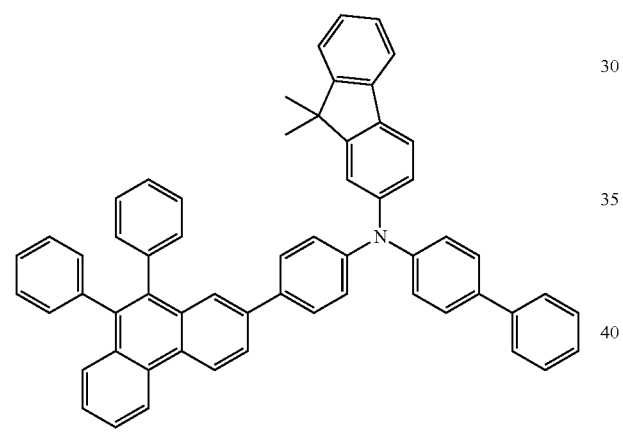
chemical formula 1-3
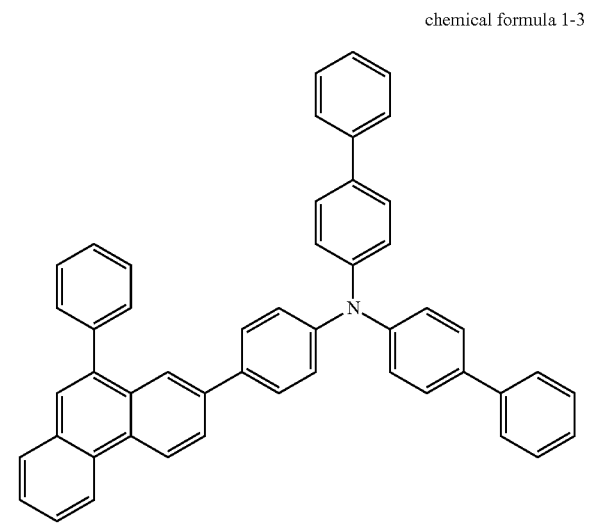
chemical formula 1-4
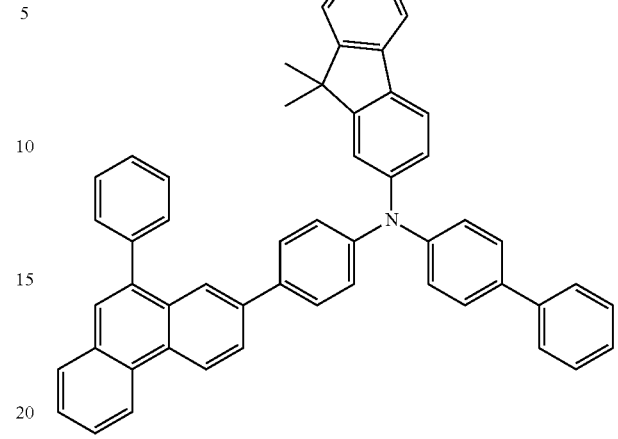
chemical formula 1-5
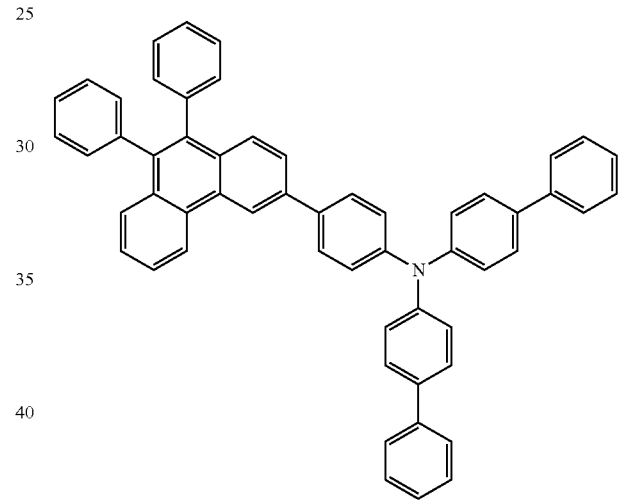
chemical formula 1-6
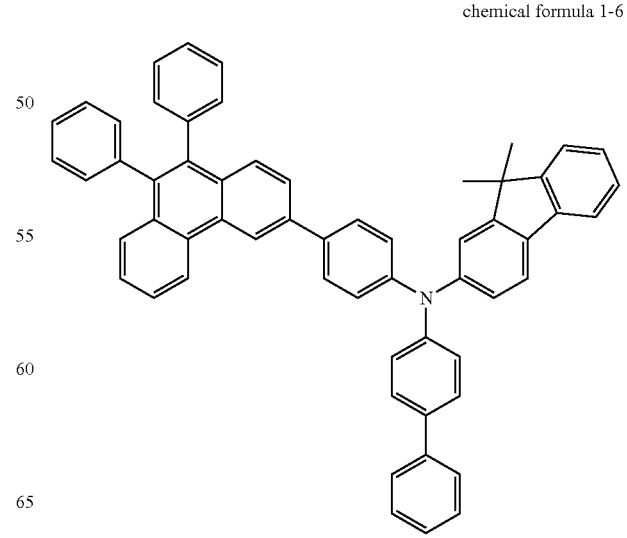

chemical formula 1-7
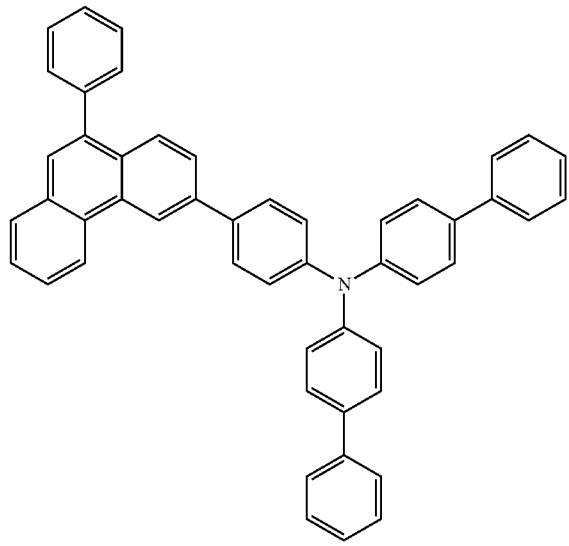
chemical formula 1-8
chemical formula 1-9
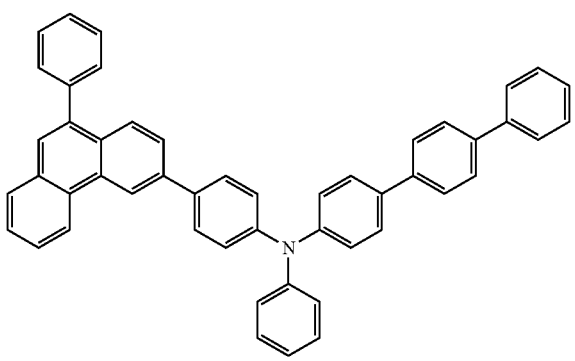
chemical formula 1-10
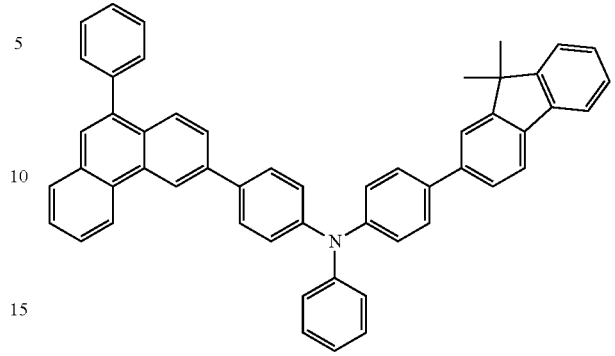
chemical formula 1-11
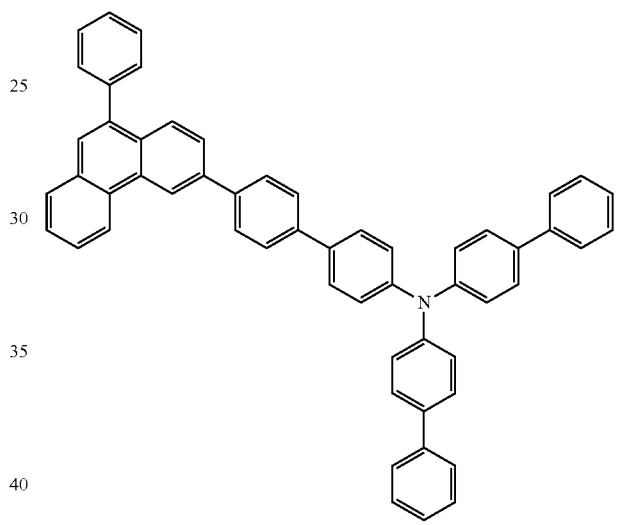
chemical formula 1-12
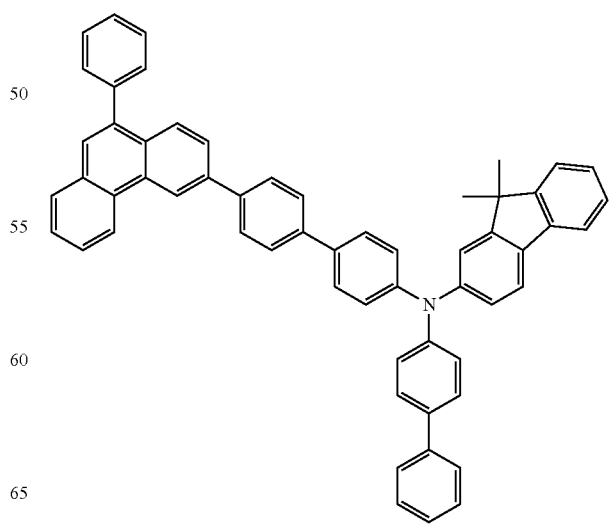

chemical formula 1-13
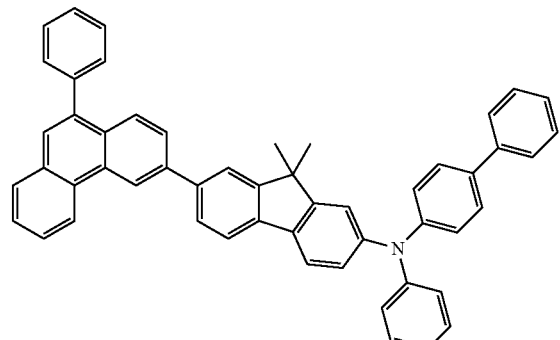
chemical formula 1-14
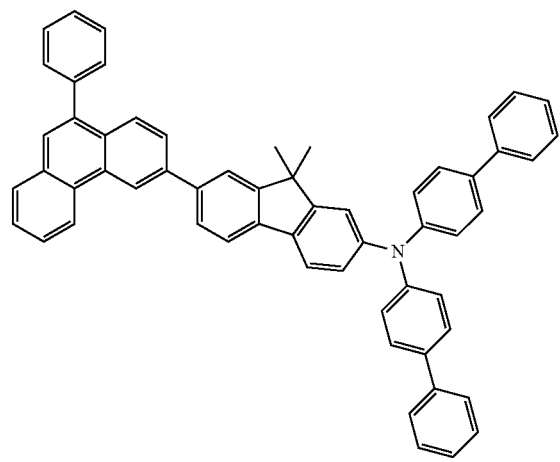
chemical formula 1-15
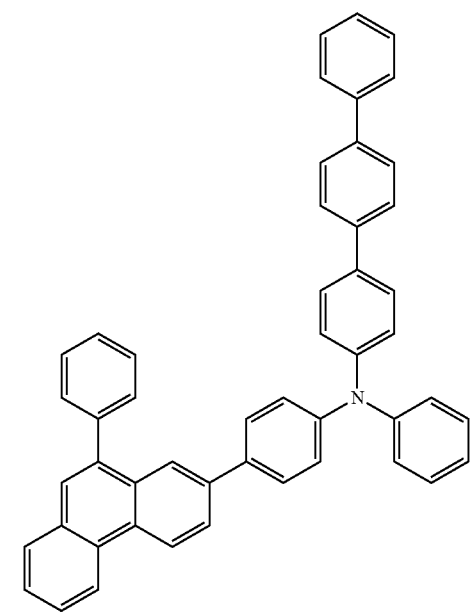
chemical formula 1-16
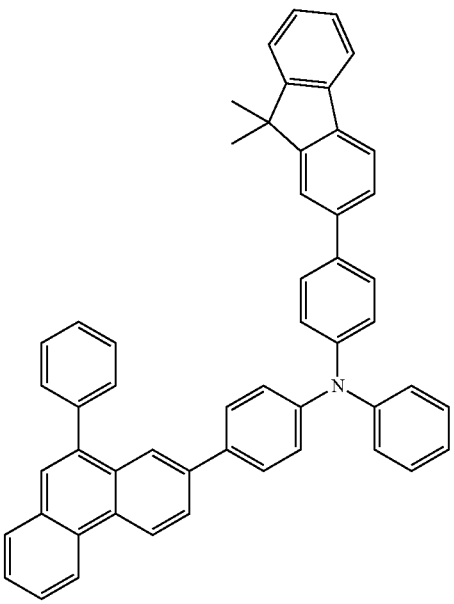
chemical formula 1-17
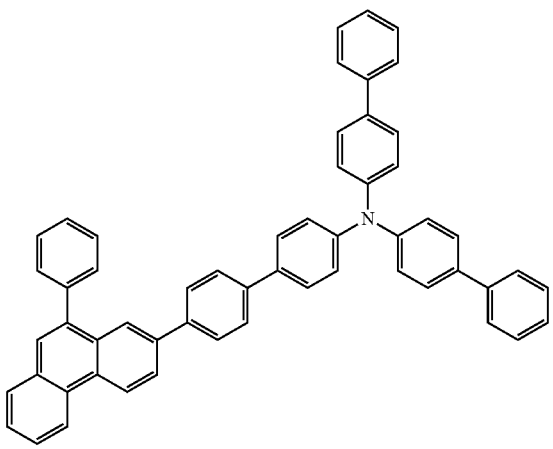
chemical formula 1-18
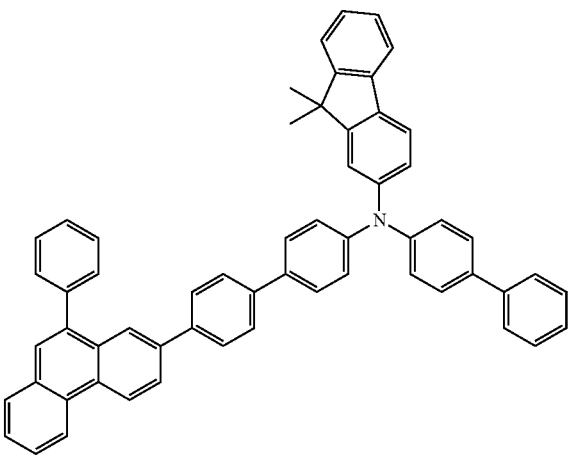

chemical formula 1-19
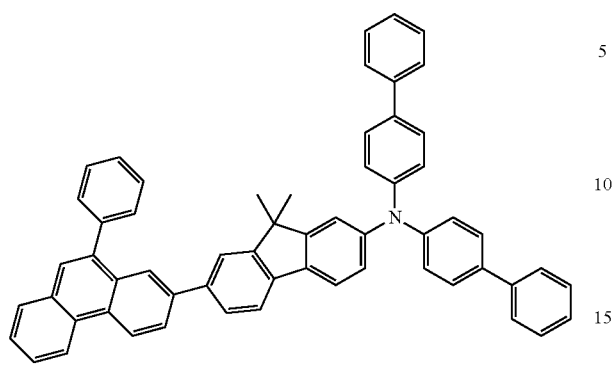
chemical formula 1-20
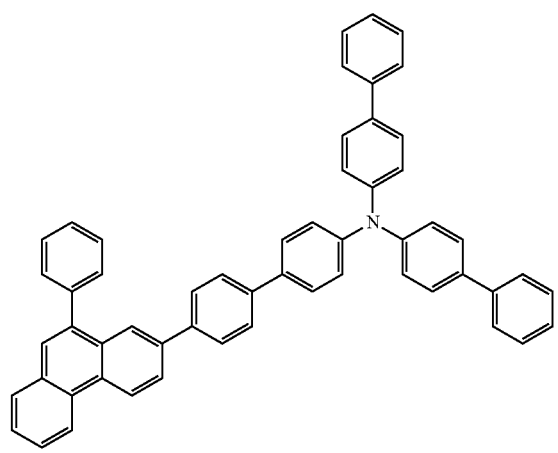
chemical formula 1-21
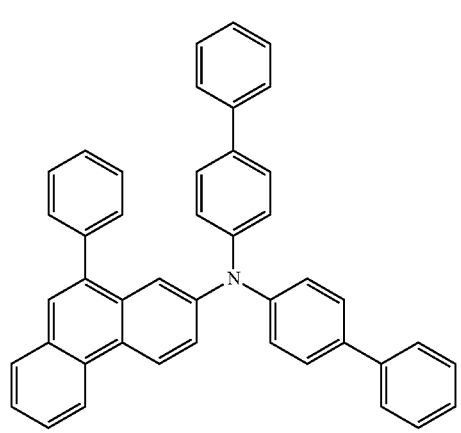
chemical formula 1-22
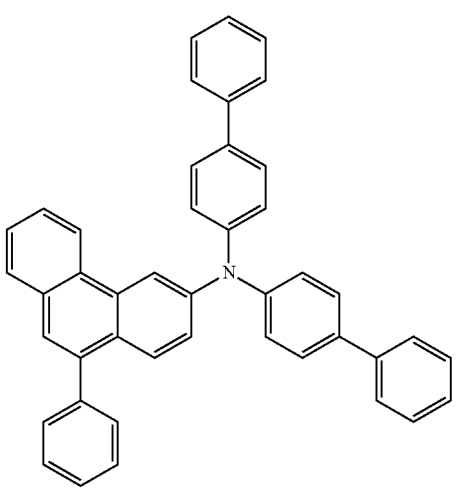
chemical formula 1-23
chemical formula 1-24
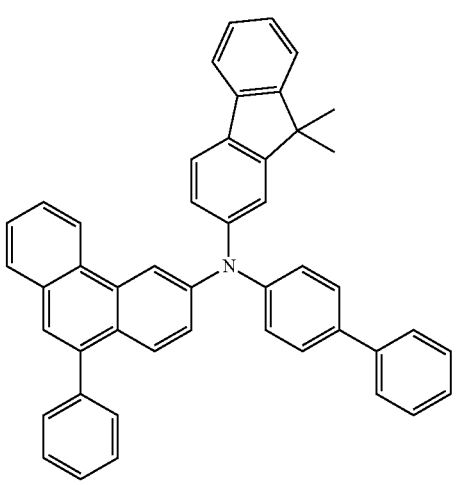
Preferable specific examples of the compound represented by Chemical Formula 1 include the following compounds, but are not limited thereto.

chemical formula 2-1
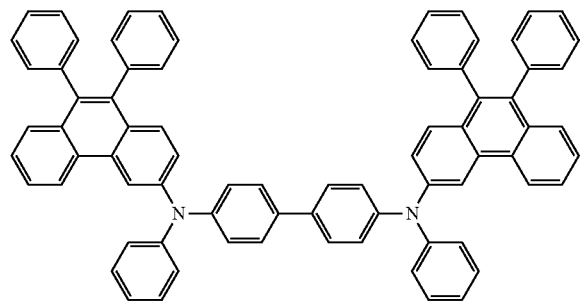
chemical formula 2-2
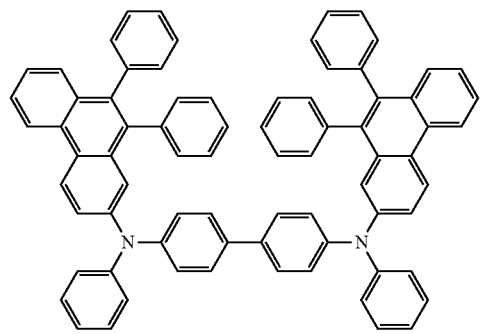
chemical formula 2-3
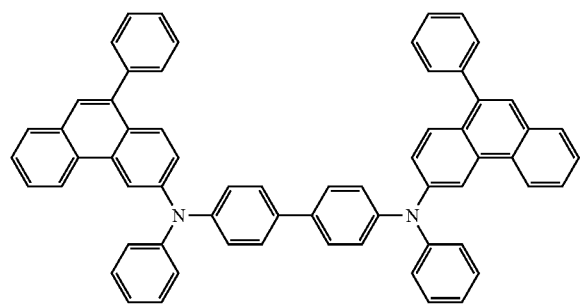
chemical formula 2-4
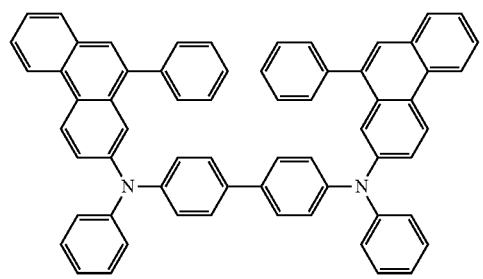
chemical formula 2-5
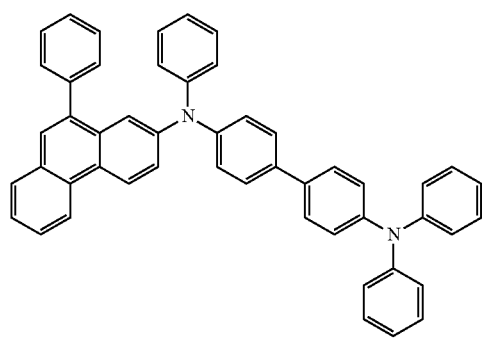
chemical formula 2-6
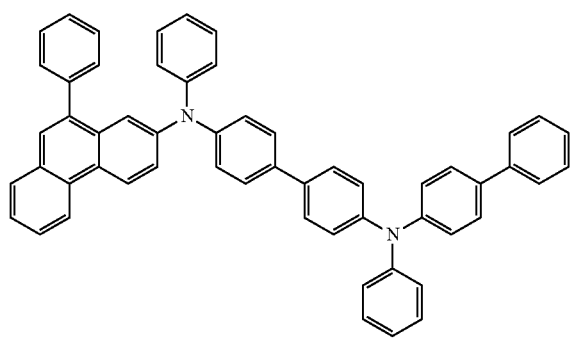
chemical formula 2-7
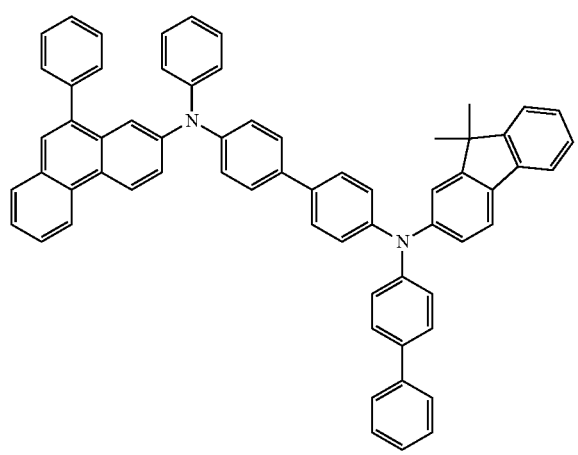
chemical formula 2-8
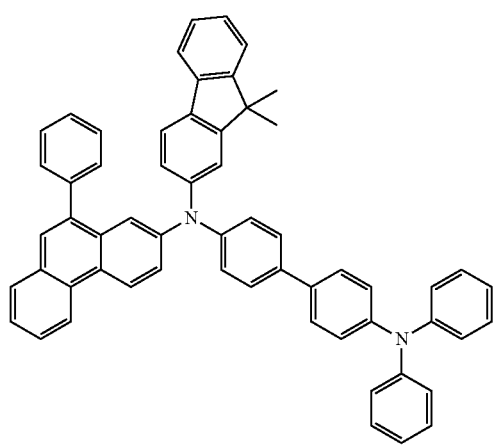

chemical formula 2-9
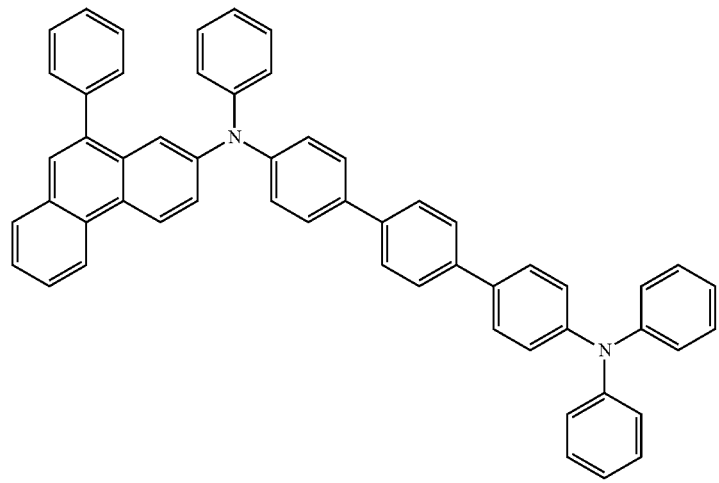
chemical formula 2-10
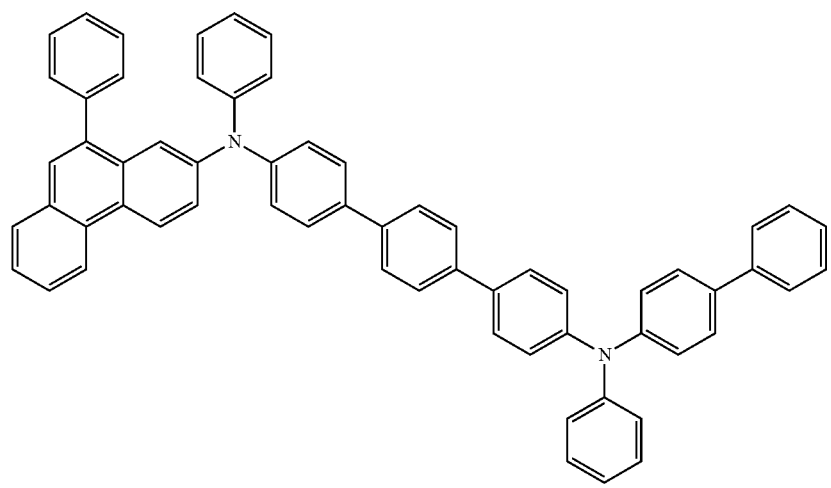
chemical formula 2-11
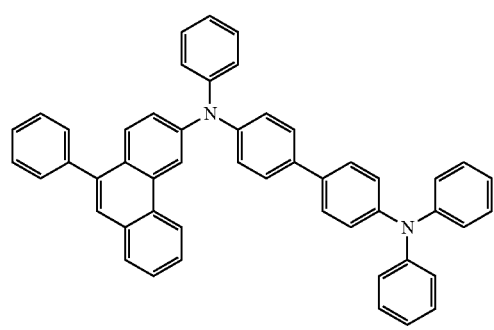
chemical formula 2-12
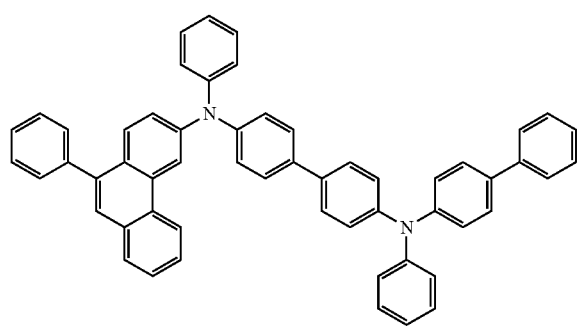

-continued
chemical formula 2-13
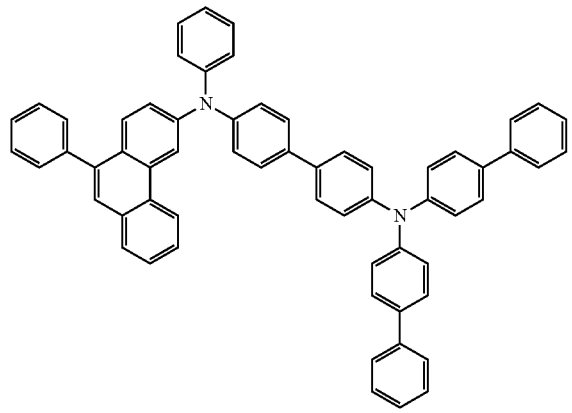
chemical formula 2-14
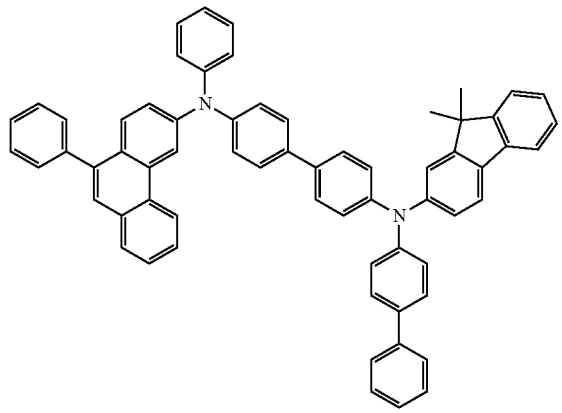
chemical formula 2-15
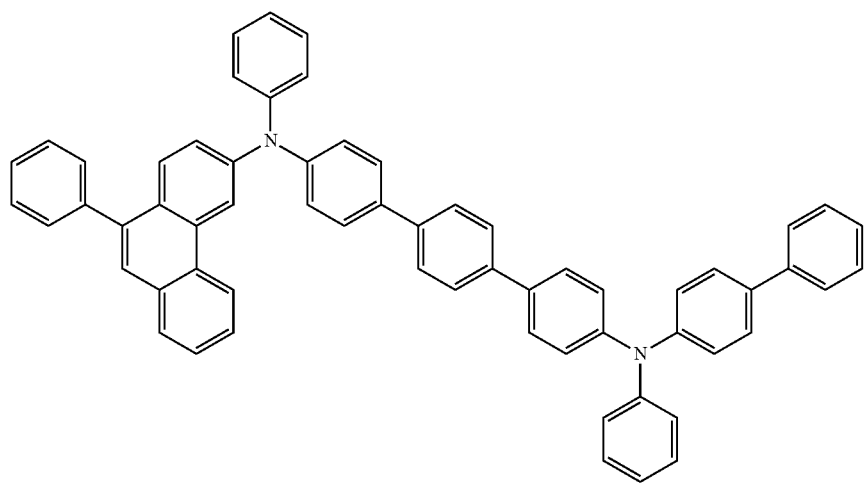
chemical formula 2-16
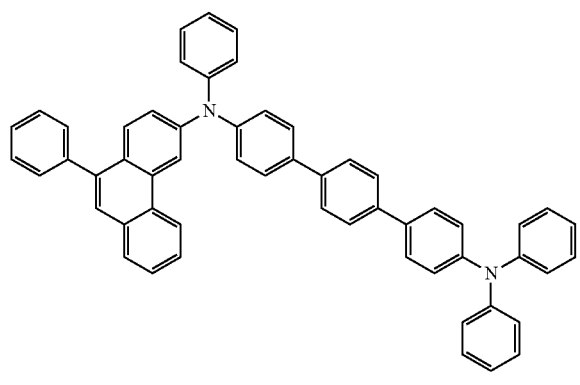
chemical formula 2-17
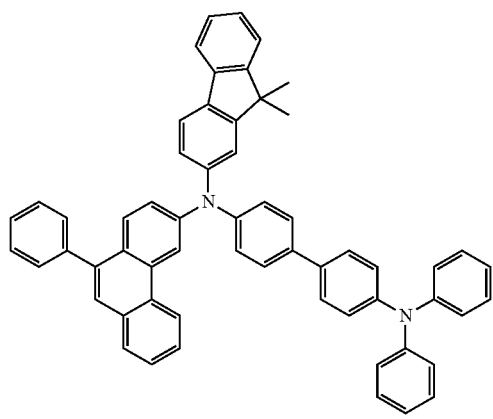

-continued
chemical formula 2-18
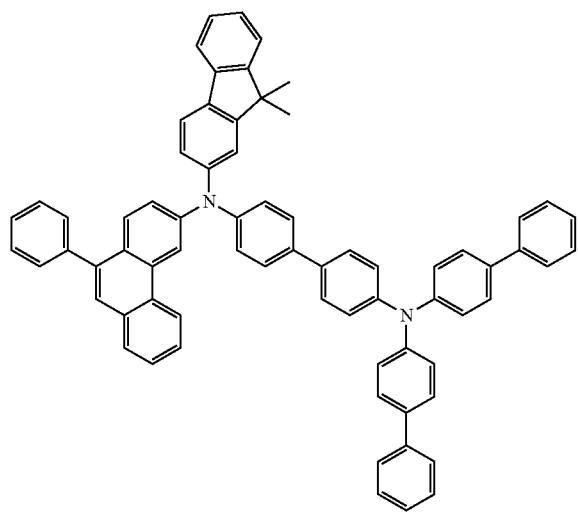
chemical formula 2-19
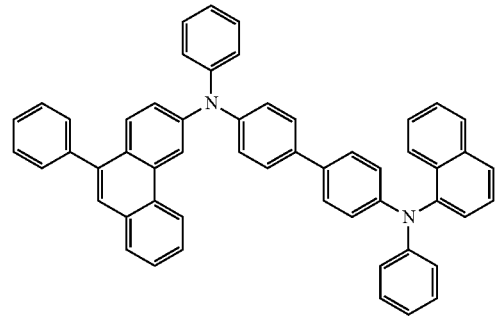
chemical formula 2-20
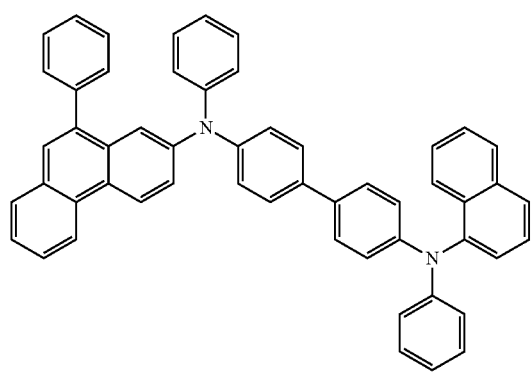
chemical formula 2-21
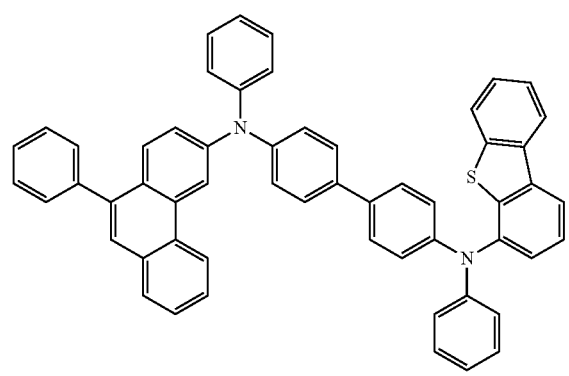
chemical formula 2-22
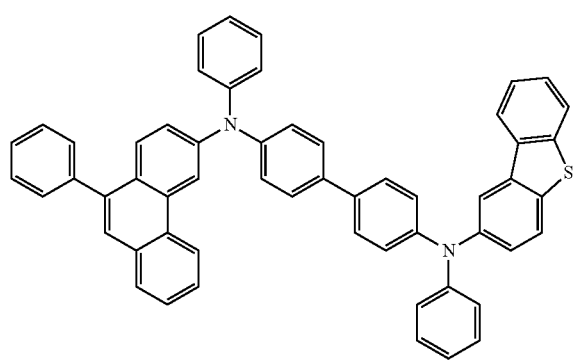
chemical formula 2-23
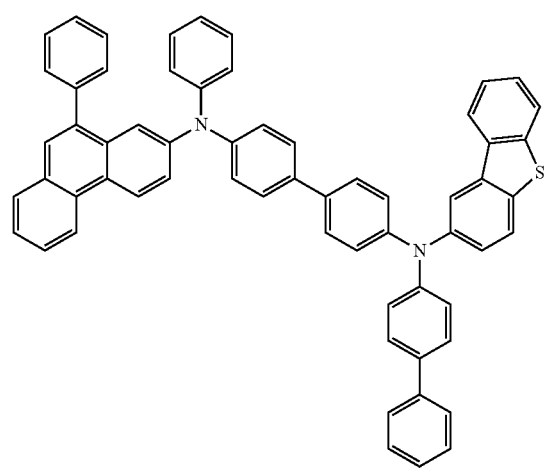

chemical formula 2-24
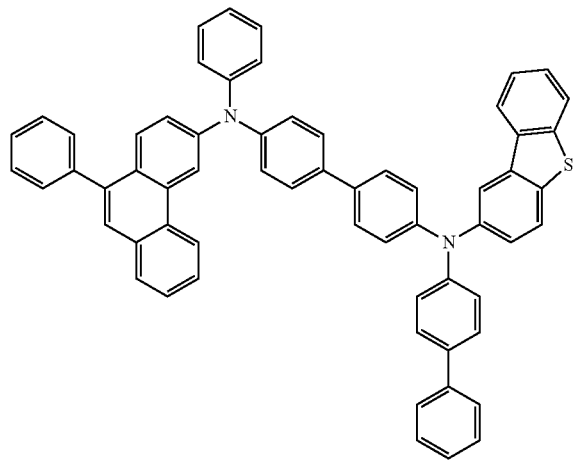
chemical formula 2-25
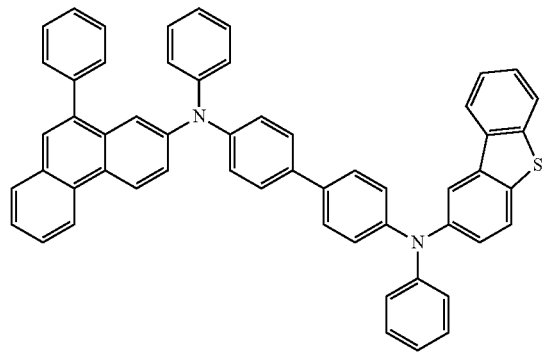
chemical formula 2-26
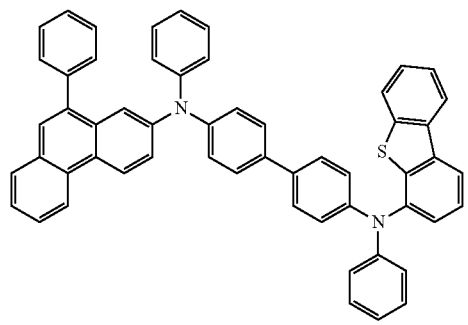
chemical formula 2-27
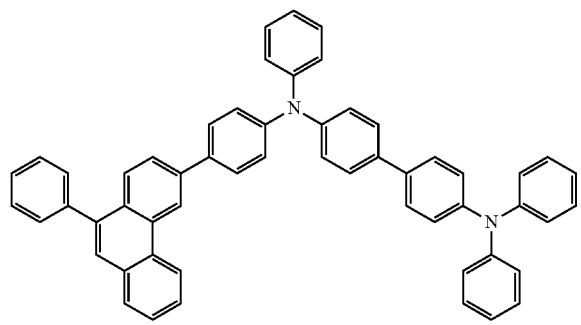
chemical formula 2-28
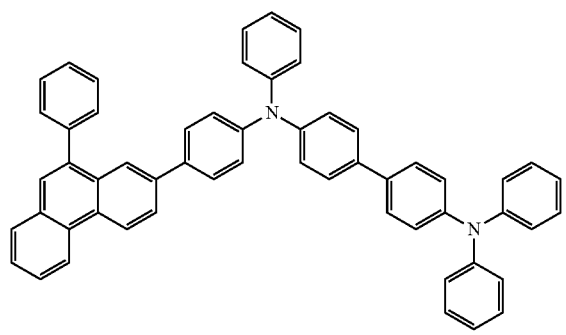
chemical formula 2-29
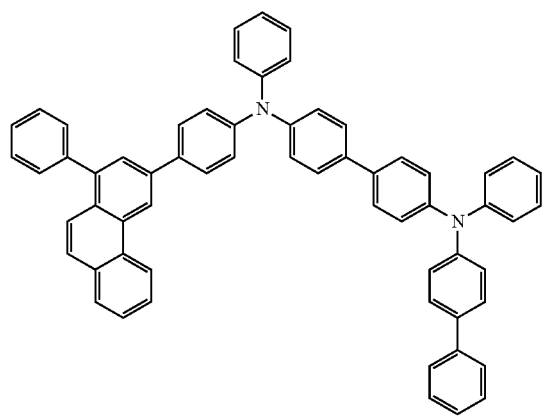

chemical formula 2-30

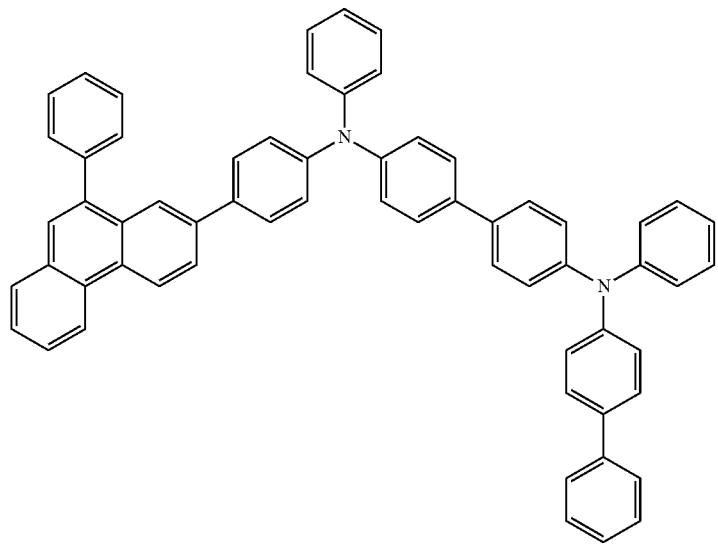

It is preferable that the compound represented by Chemical Formula 1 be applied to a hole transport layer of an organic material layer of the organic light emitting device, but the compound is not limited thereto.

Meanwhile, the compound represented by Chemical Formula 1 has a high glass transition temperature (Tg), and thus thermal stability is excellent. Such increase in thermal stability becomes an important factor providing driving stability to the device.

Further, the organic light emitting device according to the present invention is an organic light emitting device comprising a first electrode, a second electrode, and one or more organic material layers interposed between the first electrode and the second electrode, and one or more layers of the organic material layers comprise the compound represented by Chemical Formula 1.

The organic light emitting device of the present invention may be manufactured by a manufacturing method and a material of a general organic light emitting device, except that one or more organic material layers are formed by using the aforementioned compounds.

The compound of Chemical Formula 1 may form the organic material layer by a vacuum deposition method and a solution coating method when the organic light emitting device is manufactured. Herein, the solution coating method means spin coating, dip coating, inkjet printing, screen printing, a spray method, roll coating, and the like, but is not limited thereto.

The organic material layer of the organic light emitting device of the present invention may have a single layer structure, or a multilayered structure in which two or more organic material layers are laminated. For example, the organic light emitting device of the present invention may have a structure including a hole injection layer, a hole transport layer, a light emitting layer, an electron transport layer, an electron injection layer, and the like as an organic material layer. However, the structure of the organic light emitting device is not limited thereto, but may comprise a smaller number of organic material layers.

In the organic light emitting device of the present invention, the organic material layer may comprise one or more layers of the hole injection layer, the hole transport layer, and the layer injecting and transporting holes simultaneously, and one or more layers of the layers may comprise the compound represented by Chemical Formula 1.

Further, the organic material layer may comprise a light emitting layer, and the light emitting layer may comprise the compound represented by Chemical Formula 1.

Further, the organic material layer may comprise the hole transport layer, and the hole transport layer may comprise the compound represented by Chemical Formula 1.

Further, the organic material layer may comprise one or more layers of the electron transport layer, the electron injection layer, and the layer transporting and injecting electrons simultaneously, and one or more layers of the layers may comprise the compound represented by Chemical Formula 1.

In the organic material layer having the multilayered structure, the compound of Chemical Formula 1 may be comprised in the light emitting layer, a layer of injecting and transporting holes and emitting light simultaneously, a layer of transporting holes and emitting light simultaneously, a layer of transporting electrons and emitting light simultaneously, or the like.

For example, the structure of the organic light emitting device of the present invention may have a structure illustrated in FIG. 1, but is not limited thereto.

FIG. 1 illustrates a structure of an organic light emitting device, in which an anode 2, a light emitting layer 3, and a cathode 4 are sequentially laminated on a substrate 1. In the aforementioned structure, the compound represented by Chemical Formula 1 may be comprised in the light emitting layer 3.

For example, the organic light emitting device according to the present invention may be manufactured by depositing metal, metal oxides having conductivity, or an alloy thereof on the substrate by using a PVD (physical vapor deposition) method such as sputtering or e-beam evaporation to form the anode, forming the organic material layer comprising the hole injection layer, the hole transport layer, the light emitting layer, and the electron transport layer thereon, and depositing the material that is capable of being used as the cathode thereon. In addition to the aforementioned method, the organic light emitting device may be manufactured by sequentially depositing a cathode material, an organic material layer, and an anode material on the substrate.

The organic material layer may have a multilayered structure comprising the hole injection layer, the hole transport layer, the light emitting layer, the electron transport layer, and the like, but is not limited thereto and may have a single layer structure. Further, the organic material layer may be manufactured in the smaller number of layers by using various polymer materials and by using not a deposition method but a solvent process, for example, methods such as spin coating, dip coating, doctor blading, screen printing, inkjet printing, and heat transferring method.

It is preferable that the anode material be, in general, a material having a large work function so as to smoothly perform hole injection into the organic material layer. Specific examples of the anode material that can be used in the present invention include metal or an alloy thereof such as vanadium, chrome, copper, zinc, and gold; metal oxides such as zinc oxides, indium oxides, indium tin oxides (ITO), and indium zinc oxides (IZO); a combination of metal and oxides such as ZnO:Al or $SnO_2$:Sb; conductive polymers such as poly(3-methyl compound), poly[3,4-(ethylene-1,2-dioxy) compound] (PEDT), polypyrrole, and polyaniline, and the like, but are not limited thereto.

It is preferable that the cathode material be, in general, a material having a small work function so as to smoothly perform electron injection into the organic material layer. Specific examples of the cathode material include metal such as magnesium, calcium, sodium, potassium, titanium, indium, yttrium, lithium, gadolinium, aluminum, silver, tin, and lead, or an alloy thereof; and a multilayered structure material such as LiF/Al or $LiO_2$/Al, and the like, but are not limited thereto.

The hole injection material is a material that can well receive holes from the anode at a low voltage, and it is preferable that a HOMO (highest occupied molecular orbital) of the hole injection material be a value between a work function of the anode material and the HOMO of the organic material layer therearound. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone and polyaniline and polycompound-based conductive polymers, and the like, but are not limited thereto.

The hole transport material is a material that can receive the holes from the anode or the hole injection layer and transport the holes to the light emitting layer, and is preferably a material having large mobility to the holes. Specific examples thereof include an arylamine-based organic material, a conductive polymer, a block copolymer in which a conjugate portion and a non-conjugate portion are included together, and the like, but are not limited thereto.

The light emitting material is a material that can receive the holes and the electrons from the hole transport layer and the electron transport layer, respectively, and bond the holes and the electrons to emit light in a visible ray region, and is preferably a material having good quantum efficiency to fluorescence or phosphorescence. Specific examples thereof include a 8-hydroxy-quinoline aluminum complex ($Alq_3$); a carbazole-based compound; a dimerized styryl compound; BAlq; a 10-hydroxybenzoquinoline-metal compound; a benzoxazole, benzthiazole, and benzimidazole-based compound; a poly(p-phenylenevinylene) (PPV)-based polymer; a spiro compound; polyfluorene, lubrene, and the like, but are not limited thereto.

The electron transport material is a material that can receive well the electrons from the cathode and transport the electrons to the light emitting layer, and is preferably a material having large mobility to the electrons. Specific examples thereof include a 8-hydroxyquinoline Al complex; a complex including $Alq_3$; an organic radical compound; a hydroxyflavone-metal complex, and the like, but are not limited thereto.

The organic light emitting device according to the present invention may be a top emission type, a bottom emission type, or a both-sided emission type according to the used material.

MODE FOR INVENTION

Hereinafter, preferable Examples will be described in order to help understanding of the present invention. However, the following Examples are set forth to illustrate the present invention, but the scope of the present invention is not limited thereto.

EXAMPLE

Preparation Example 1

Synthesis of the Compound of Chemical Formula 1-3

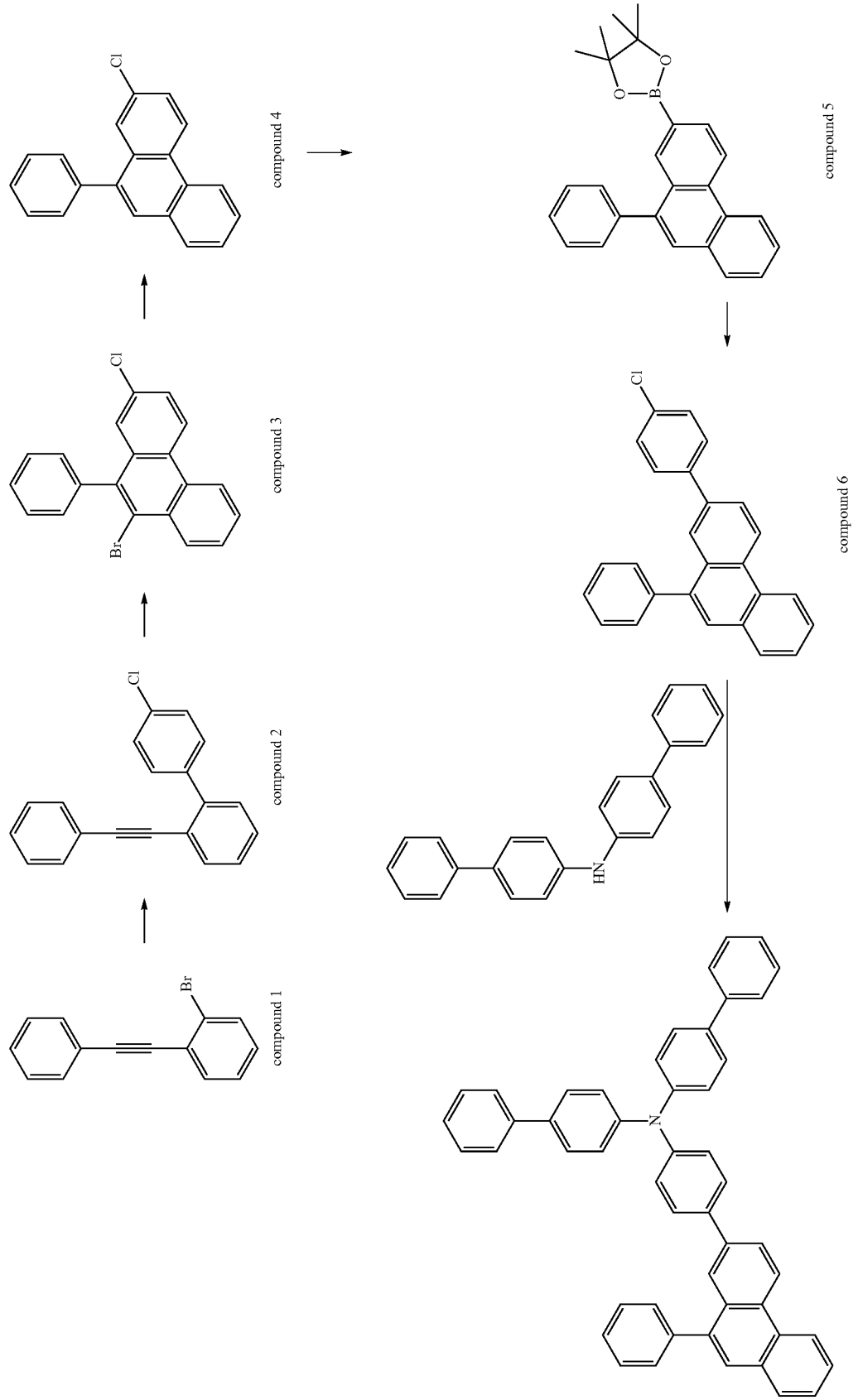

<Preparation of Compound 1>

1-bromo-2-iodobenzene (50 g, 176.7 mmol), phenylacetylene (21.7 g, 212.5 mmol), and 800 ml of triethylamine were put into the 2 L round bottom flask, and agitated. Bis(triphenylphosphine)palladium dichloride (2.48 g, 3.54 mmol) and copper iodide (0.34 g, 1.79 mmol) were put, and agitated at 60° C. for 5 hours. Cooling was performed to normal temperature, and the generated solid was filtered. The filtered liquid was distilled under reduced pressure to be concentrated, and subjected to column purification to obtain compound 1 (28.2 g, 109.7 mmol) at a yield of 62.1%. MS: $[M+H]^+=258$ <Preparation of Compound 2>

Compound 1 (25 g, 97.2 mmol), 4-chlorophenylboronic acid (16.7 g, 107 mmol), potassium carbonate (53.7 g, 388.8 mmol), tetrakis(triphenylphosphine)palladium (2.3 g, 2 mmol), 400 ml of tetrahydrofuran, and 200 ml of water were put into the 1 L round bottom flask, and refluxed while being agitated for 8 hours. Cooling was performed to normal temperature, and the organic layer was separated. The resulting material was distilled under reduced pressure to be concentrated, and subjected to column purification to obtain compound 2 (19.8 g, 68.7 mmol) at a yield of 70.7%. MS: $[M+H]^+=289$ <Preparation of Compound 3>

Compound 2 (15 g, 51.9 mmol) was dissolved in 500 ml of dichloromethane and N-bromosuccinimide (11 g, 61.8 mmol) and 9 g of silica gel were put into the 1 L round bottom flask, and agitated for 18 hours. After the reaction was finished, 100 ml of the sodium thiosulfate aqueous solution was added and agitated for 20 min, and the organic layer was then separated. The separated organic layer was washed by 200 ml of the sodium chloride aqueous solution and then dried by magnesium sulfate anhydride. The solution was filtered, concentrated under reduced pressure, and subjected to column purification to obtain compound 3 (15.2 g, 41.3 mmol) at a yield of 79.7%. MS: $[M+H]^+=368$ <Preparation of Compound 4>

The nitrogen line was connected to the 500 ml round bottom flask dried in the oven, and compound 3 (15 g, 40.8 mmol) and 300 ml of tetrahydrofuran anhydride were put thereinto. After cooling was performed to −78° C., normal butyl lithium (2.5M hexane solution; 18 ml, 45 mmol) was slowly put and agitated for 30 mins. 20 ml of water was put, and agitated for 30 mins, and the temperature was increased to normal temperature. The organic layer was separated, dried by magnesium sulfate anhydride, and filtered. The resulting material was distilled under reduced pressure to be concentrated, and subjected to column purification to obtain compound 4 (9.6 g, 33.2 mmol) at a yield of 81.5%. MS: $[M+H]^+=289$ <Preparation of Compound 5>

Compound 4 (9.6 g, 33.2 mmol), bis(pinacolato)diboron (10.1 g, 39.8 mmol), potassium acetate (9.77 g, 99.6 mmol), and 100 ml of dioxane were put into the 250 ml round bottom flask, and agitated while being heated. Bis(dibenzylidyneacetone) palladium (0.38 g, 0.66 mmol) and tricyclohexylphosphine (0.37 g, 1.33 mmol) were put in the reflux state, and agitated for 6 hours. After cooling was performed to normal temperature, 50 ml of water was put and agitated. The organic layer was separated, and dried by magnesium sulfate anhydride. The resulting material was distilled under reduced pressure to be concentrated, and subjected to column purification to obtain compound 5 (8.7 g, 22.9 mmol) at a yield of 69.9%. MS: $[M+H]^+=381$ <Preparation of Compound 6>

Compound 5 (8.7 g, 22.9 mmol), 1-bromo-4-chlorobenzene (4.38 g, 22.9 mmol), potassium carbonate (12.7 g, 91.6 mmol), tetrakis(triphenylphosphine)palladium (0.53 g, 0.46 mmol), 100 ml of tetrahydrofuran, and 50 ml of water were put into the 250 ml round bottom flask, and refluxed while being agitated for 8 hours. Cooling was performed to normal temperature, and the organic layer was separated. The resulting material was distilled under reduced pressure to concentrate, and then subjected to column purification to obtain compound 6 (5.9 g, 16.2 mmol) at a yield of 70.6%. MS: $[M+H]^+=365$ <Preparation of the Compound of Chemical Formula 1-3>

Compound 6 (5 g, 13.7 mmol), bis(4-biphenyl)amine (4.8 g, 14.9 mmol), sodium tert-butoxide (1.71 g, 17.8 mmol), bis(tritert-butylphosphine)palladium (0.1 g, 0.2 mmol), and 80 ml of xylene were put into the 250 ml round bottom flask, and refluxed while being agitated for 8 hours. Cooling was performed to normal temperature, and 5 g of cellite 545 was put thereinto and agitated for 30 mins. The reaction solution was filtered, and distilled under reduced pressure to be concentrated. The column purification was performed to obtain the compound of Chemical Formula 1-3 (5.4 g, 8.3 mmol) at a yield of 60.6%. MS: $[M+H]^+=650$ Preparation Example 2

Synthesis of the Compound of Chemical Formula 1-4

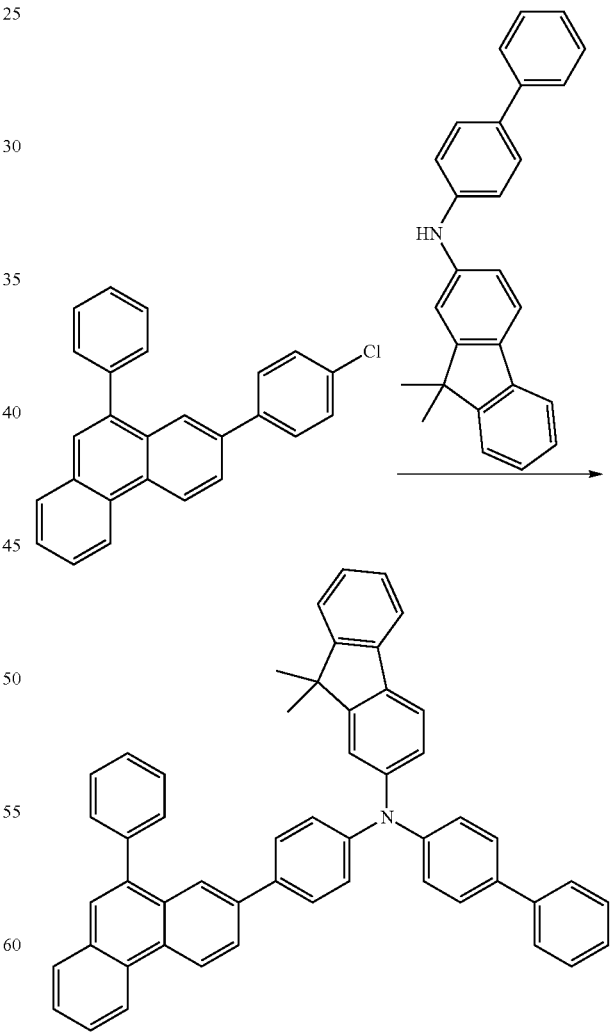

chemical formula 1-4

Chemical Formula

<Preparation of the Compound of Chemical Formula 1-4>

Compound 6 (8 g, 21.9 mmol) of Preparation Example 1, N-(4-biphenyl)-(9,9-dimethylpropen-2-yl)amine (8.7 g, 24.1 mmol), sodium tert-butoxide (2.74 g, 28.5 mmol), bis(tritert-butylphosphine)palladium (0.22 g, 0.43 mmol), and 80 ml of xylene were put into the 250 ml round bottom flask, and refluxed while being agitated for 8 hours. Cooling was performed to normal temperature, and 5 g of cellite 545 was put thereinto and agitated for 30 mins. The reaction solution was filtered, and distilled under reduced pressure to be concentrated. The column purification was performed to obtain Chemical Formula 1-4 (9.8 g, 14.2 mmol) at a yield of 64.9%. MS: [M+H]$^+$=690

Preparation Example 3

Synthesis of the Compound of Chemical Formula 1-7

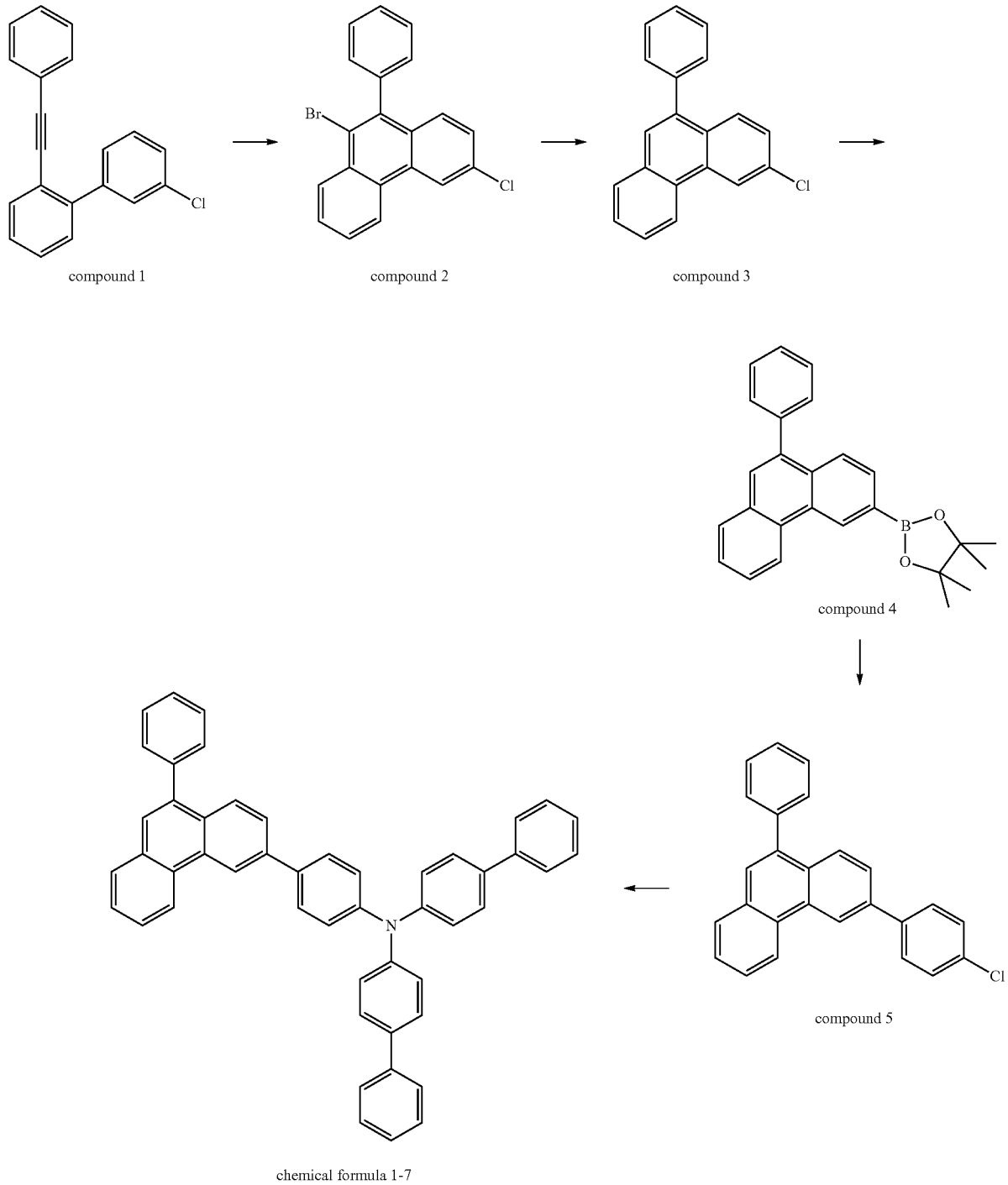

chemical formula 1-7

<Preparation of Compound 1>

Compound 1 (30 g, 116.7 mmol), 3-chlorophenylboronic acid (20 g, 128 mmol), potassium carbonate (64.5 g, 466.8 mmol), tetrakis(triphenylphosphine)palladium (2.3 g, 2 mmol), 450 ml of tetrahydrofuran, and 250 ml of water were put into the 1 L round bottom flask, and refluxed while being agitated for 8 hours. Cooling was performed to normal temperature, and the organic layer was separated. The resulting material was distilled under reduced pressure to be concentrated, and subjected to column purification to obtain compound 1 (24.7 g, 85.5 mmol) at a yield of 73.3%. MS: [M+H]$^+$= 289

<Preparation of Compound 2>

Compound 1 (24.7 g, 85.5 mmol) was dissolved in 600 ml of dichloromethane and N-bromosuccinimide (18 g, 101.1 mmol) and 11 g of silica gel were put into the 1 L round bottom flask, and agitated for 21 hours. After the reaction was finished, 150 ml of the sodium thiosulfate aqueous solution was added and agitated for 20 min, and the organic layer was then separated. The separated organic layer was washed by 200 ml of the sodium chloride aqueous solution and then dried by magnesium sulfate anhydride. The solution was filtered, concentrated under reduced pressure, and subjected to column purification to obtain compound 2 (12.1 g, 32.9 mmol) at a yield of 38.5%. MS: [M+H]$^+$=368

<Preparation of Compound 3>

The nitrogen line was connected to the 500 ml round bottom flask dried in the oven, and compound 2 (12.1 g, 32.9 mmol) and 300 ml of tetrahydrofuran anhydride were put thereinto. After cooling was performed to −78° C., normal butyl lithium (2.5M hexane solution; 14.5 ml, 36.3 mmol) was slowly put and agitated for 30 mins. 20 ml of water was put, and agitated for 30 mins, and the temperature was increased to normal temperature. The organic layer was separated, dried by magnesium sulfate anhydride, and filtered. The resulting material was distilled under reduced pressure to be concentrated, and subjected to column purification to obtain compound 3 (7.1 g, 24.6 mmol) at a yield of 74.7%. MS: [M+H]$^+$=289

<Preparation of Compound 4>

Compound 3 (7 g, 24.2 mmol), bis(pinacolato)diboron (7.3 g, 28.7 mmol), potassium acetate (7.1 g, 72.3 mmol), and 90 ml of dioxane were put into the 250 ml round bottom flask, and agitated while being heated. Bis(dibenzylidyneacetone) palladium (0.28 g, 0.49 mmol) and tricyclohexylphosphine (0.27 g, 0.97 mmol) were put in the reflux state, and agitated for 6 hours. After cooling was performed to normal temperature, 50 ml of water was put and agitated. The organic layer was separated, and dried by magnesium sulfate anhydride. The resulting material was distilled under reduced pressure to be concentrated, and subjected to column purification to obtain compound 4 (6.9 g, 18.1 mmol) at a yield of 75%. MS: [M+H]$^+$=381

<Preparation of Compound 5>

Compound 4 (6.9 g, 18.1 mmol), 1-bromo-4-chlorobenzene (3.47 g, 18.1 mmol), potassium carbonate (10 g, 72.4 mmol), tetrakis(triphenylphosphine)palladium (0.42 g, 0.36 mmol), 100 ml of tetrahydrofuran, and 50 ml of water were put into the 250 ml round bottom flask, and refluxed while being agitated for 8 hours. Cooling was performed to normal temperature, and the organic layer was separated. The resulting material was distilled under reduced pressure to be concentrated, and subjected to column purification to obtain compound 5 (4.8 g, 13.2 mmol) at a yield of 72.7%. MS: [M+H]$^+$=365

<Preparation of the Compound of Chemical Formula 1-7>

Compound 5 (4.8 g, 13.2 mmol), bis(4-biphenyl)amine (4.66 g, 14.5 mmol), sodium tert-butoxide (1.65 g, 17.2 mmol), bis(tritert-butylphosphine)palladium (0.13 g, 0.26 mmol), and 80 ml of xylene were put into the 250 ml round bottom flask, and refluxed while being agitated for 8 hours. Cooling was performed to normal temperature, and 5 g of cellite 545 was put thereinto and agitated for 30 mins. The reaction solution was filtered, and distilled under reduced pressure to be concentrated. The column purification was performed to obtain the compound of Chemical Formula 1-7 (5.6 g, 8.6 mmol) at a yield of 65.2%. MS: [M+H]$^+$=650

Preparation Example 4

Synthesis of the Compound of Chemical Formula 1-8

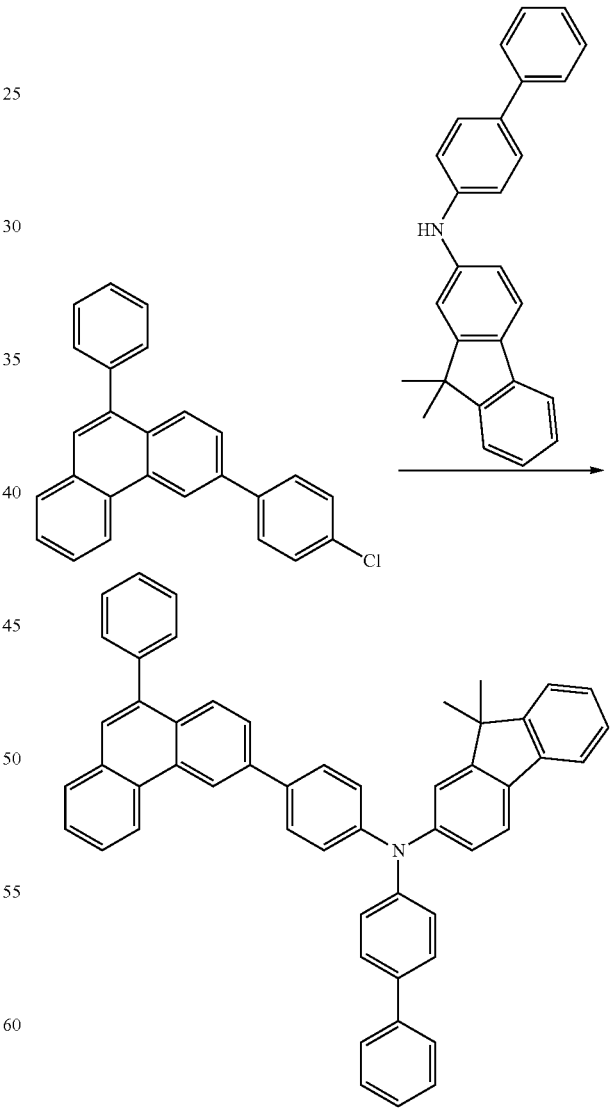

chemical formula 1-8

<Preparation of the Compound of Chemical Formula 1-8>

Compound 5 (5 g, 13.7 mmol) of Preparation Example 3, N-(4-biphenyl)-(9,9-dimethylpropen-2-yl)amine (5.4 g, 14.9 mmol), sodium tert-butoxide (1.71 g, 17.8 mmol), bis(tri tert-butylphosphine)palladium (0.14 g, 0.27 mmol), and 60 ml of xylene were put into the 100 ml round bottom flask, and refluxed while being agitated for 8 hours. Cooling was performed to normal temperature, and 5 g of cellite 545 was put thereinto and agitated for 30 mins. The reaction solution was filtered, and distilled under reduced pressure to be concentrated. The column purification was performed to obtain the compound of Chemical Formula 1-8 (5.6 g, 8.6 mmol) at a yield of 62.8%. MS: [M+H]$^+$=690

Preparation Example 5

Synthesis of the Compound of Chemical Formula 2-5

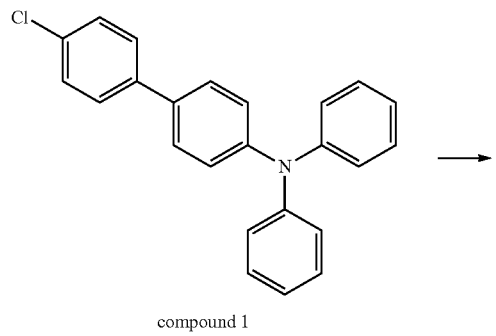

compound 1

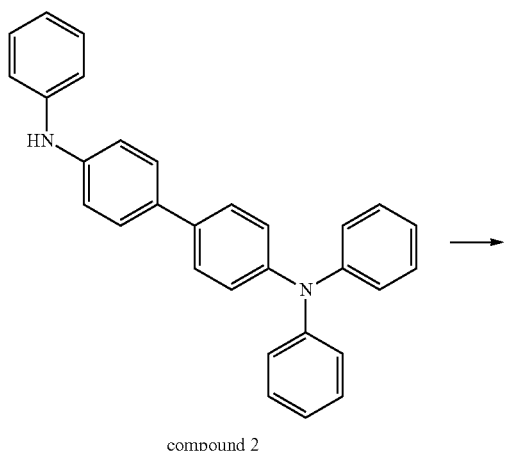

compound 2

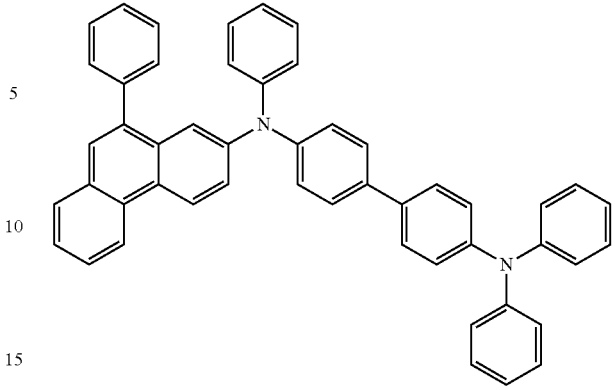

chemical formula 2-5

<Preparation of Compound 1>

4-bromotriphenylamine (30 g, 92.5 mmol), 4-chlorophenylboronic acid (15.8 g, 101 mmol), potassium carbonate (51.1 g, 370 mmol), tetrakis(triphenylphosphine)palladium (2.3 g, 2 mmol), 200 ml of tetrahydrofuran, and 100 ml of water were put into the 500 ml round bottom flask, and refluxed while being agitated for 8 hours. Cooling was performed to normal temperature, and the organic layer was separated. The resulting material was distilled under reduced pressure to be concentrated, and re-crystallized by tetrahydrofuran and ethanol to obtain compound 1 (26.7 g, 75 mmol) at a yield of 81.1%. MS: [M+H]$^+$=356

<Preparation of Compound 2>

Compound 1 (25 g, 70.3 mmol), aniline (7.2 g, 77.3 mmol), sodium tert-butoxide (8.78 g, 91.4 mmol), bis(tri tert-butylphosphine)palladium (0.72 g, 1.41 mmol), and 300 ml of xylene were put into the 500 ml round bottom flask, and refluxed while being agitated for 8 hours. Cooling was performed to normal temperature, and 20 g of cellite 545 was put thereinto and agitated for 30 mins. The reaction solution was filtered, and distilled under reduced pressure to be concentrated. Re-crystallization was performed by tetrahydrofuran and ethanol to obtain compound 2 (21.6 g, 52.3 mmol) at a yield of 74.5%. MS: [M+H]$^+$=413

<Preparation of the Compound of Chemical Formula 2-5>

Compound 2 (10 g, 24.2 mmol), compound 4 (6.6 g, 22.9 mmol) of Preparation Example 1, sodium tert-butoxide (2.86 g, 29.8 mmol), bis(tri tert-butylphosphine)palladium (0.24 g, 0.47 mmol), and 120 ml of xylene were put into the 250 ml round bottom flask, and refluxed while being agitated for 8 hours. Cooling was performed to normal temperature, and 7 g of cellite 545 was put thereinto and agitated for 30 mins. The reaction solution was filtered, and distilled under reduced pressure to be concentrated. The column purification was performed to obtain Chemical Formula 2-5 (9.2 g, 13.8 mmol) at a yield of 60.3%. MS: [M+H]$^+$=665

Preparation Example 6
Synthesis of the Compound of Chemical Formula 2-7
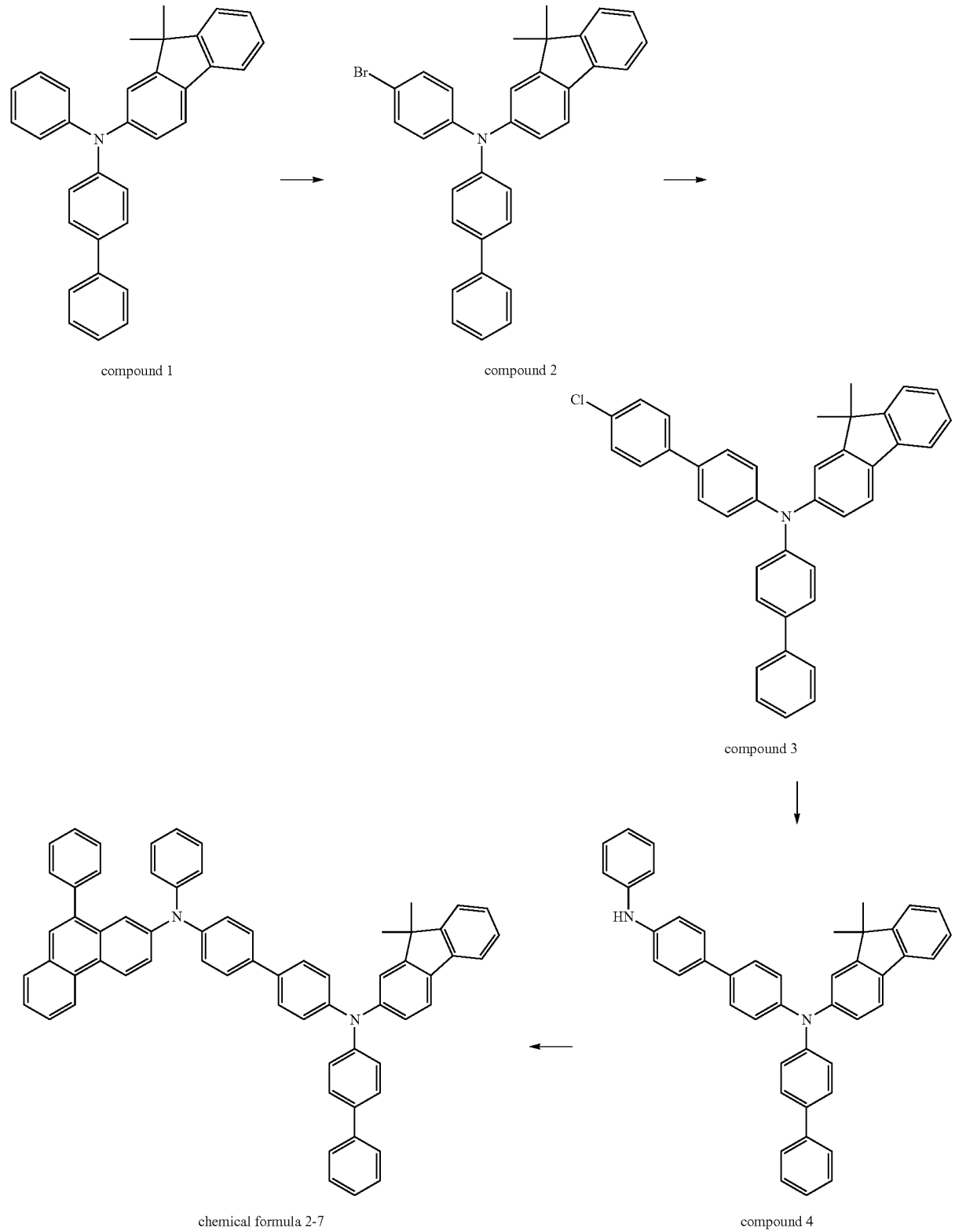 [SMILES: CC1(C)c2ccccc2-c2ccc(N(c3ccccc3)c3ccc(-c4ccccc4)cc3)cc21 ; CC1(C)c2ccccc2-c2ccc(N(c3ccc(Br)cc3)c3ccc(-c4ccccc4)cc3)cc21 ; CC1(C)c2ccccc2-c2ccc(N(c3ccc(-c4ccccc4)cc3)c3ccc(-c4ccc(Cl)cc4)cc3)cc21 ; CC1(C)c2ccccc2-c2ccc(N(c3ccc(-c4ccccc4)cc3)c3ccc(-c4ccc(N(c5ccccc5)c5ccc6c(c5)c(-c5ccccc5)cc5ccccc56)cc4)cc3)cc21 ; CC1(C)c2ccccc2-c2ccc(N(c3ccc(-c4ccccc4)cc3)c3ccc(-c4ccc(Nc5ccccc5)cc4)cc3)cc21]

<Preparation of Compound 1>

N-(4-biphenyl)-(9,9-dimethylpropen-2-yl)amine (50 g, 138.3 mmol), bromobenzene (23 g, 146.5 mmol), sodium tert-butoxide (17.2 g, 179 mmol), bis(tri tert-butylphosphine) palladium (1.4 g, 2.74 mmol), and 600 ml of xylene were put into the 1 L round bottom flask, and refluxed while being agitated for 8 hours. Cooling was performed to normal temperature, and 50 g of cellite 545 was put thereinto and agitated for 30 mins. The reaction solution was filtered, and distilled under reduced pressure to be concentrated. Re-crystallization was performed by tetrahydrofuran and ethanol to obtain compound 1 (43.1 g, 98.5 mmol) at a yield of 71.2%. MS: $[M+H]^+= 438$ <Preparation of Compound 2>

Compound 1 (40 g, 91.4 mmol) was dissolved in 500 ml of chloroform and N-bromosuccinimide (17 g, 95.5 mmol) was slowly put into the 1 L round bottom flask for 10 min, and agitated for 4 hours. After 100 ml of the sodium thiosulfate aqueous solution was put and agitated for 20 mins, the organic layer was separated. The separated organic layer was washed by 50 ml of the sodium chloride aqueous solution and then dried by magnesium sulfate anhydride. The solution was filtered, concentrated under reduced pressure, and re-crystallized by chloroform and ethanol to obtain compound 2 (35.4 g, 68.5 mmol) at a yield of 74.9%. MS: $[M+H]^+=517$ <Preparation of Compound 3>

Compound 2 (30 g, 58.1 mmol), 4-chlorophenylboronic acid (10 g, 63.9 mmol), potassium carbonate (32.1 g, 232.4 mmol), tetrakis(triphenylphosphine)palladium (1.4 g, 1.2 mmol), 300 ml of tetrahydrofuran, and 140 ml of water were put into the 500 ml round bottom flask, and refluxed while being agitated for 8 hours. Cooling was performed to normal temperature, and the organic layer was separated. The resulting material was distilled under reduced pressure to be concentrated, and re-crystallized by tetrahydrofuran and ethanol to obtain compound 3 (24.7 g, 45.1 mmol) at a yield of 77.6%. MS: $[M+H]^+=548$ <Preparation of Compound 4>

Compound 3 (24.7 g, 45.1 mmol), aniline (4.6 g, 49.4 mmol), sodium tert-butoxide (5.6 g, 5.83 mmol), bis(tri tert-butylphosphine)palladium (0.46 g, 0.9 mmol), and 300 ml of xylene were put into the 500 ml round bottom flask, and refluxed while being agitated for 8 hours. Cooling was performed to normal temperature, and 20 g of cellite 545 was put thereinto and agitated for 30 mins. The reaction solution was filtered, and distilled under reduced pressure to be concentrated. Re-crystallization was performed by tetrahydrofuran and ethanol to obtain compound 4 (21.8 g, 36 mmol) at a yield of 79.9%. MS: $[M+H]^+=605$ <Preparation of the Compound of Chemical Formula 2-7>

Compound 4 (10 g, 16.5 mmol), compound 4 (4.8 g, 16.6 mmol) of Preparation Example 1, sodium tert-butoxide (2.06 g, 21.4 mmol), bis(tri tert-butylphosphine)palladium (0.17 g, 0.33 mmol), and 120 ml of xylene were put into the 250 ml round bottom flask, and refluxed while being agitated for 8 hours. Cooling was performed to normal temperature, and 7 g of cellite 545 was put thereinto and agitated for 30 mins. The reaction solution was filtered, and distilled under reduced pressure to be concentrated. The column purification was performed to obtain Chemical Formula 2-7 (8.3 g, 9.7 mmol) at a yield of 58.7%. MS: $[M+H]^+=857$ Preparation Example 7

Synthesis of the Compound of Chemical Formula 2-11

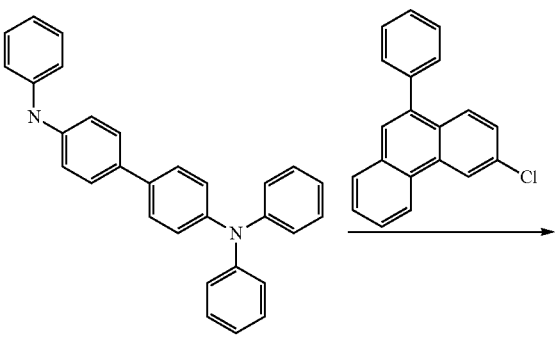

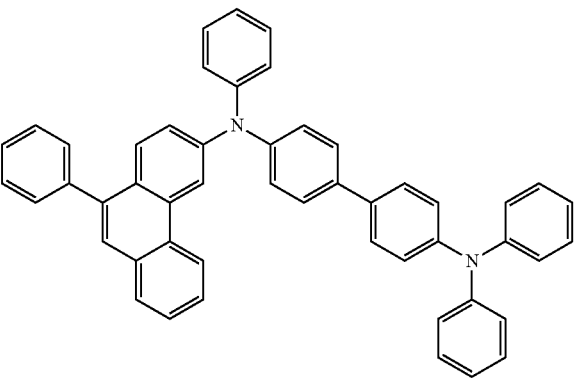

chemical formula 2-11

Preparation of the Compound of Chemical Formula 2-11>

Compound 2 (10 g, 24.2 mmol) of Preparation Example 5, compound 3 (6.6 g, 22.9 mmol) of Preparation Example 3, sodium tert-butoxide (2.86 g, 29.8 mmol), bis(tri tert-butylphosphine)palladium (0.24 g, 0.47 mmol), and 120 ml of xylene were put into the 250 ml round bottom flask, and refluxed while being agitated for 8 hours. Cooling was performed to normal temperature, and 7 g of cellite 545 was put thereinto and agitated for 30 mins. The reaction solution was filtered, and distilled under reduced pressure to be concentrated. The column purification was performed to obtain Chemical Formula 2-11 (8.8 g, 13.2 mmol) at a yield of 57.8%. MS: $[M+H]^+=665$ Preparation Example 8
Synthesis of the Compound of Chemical Formula 2-13
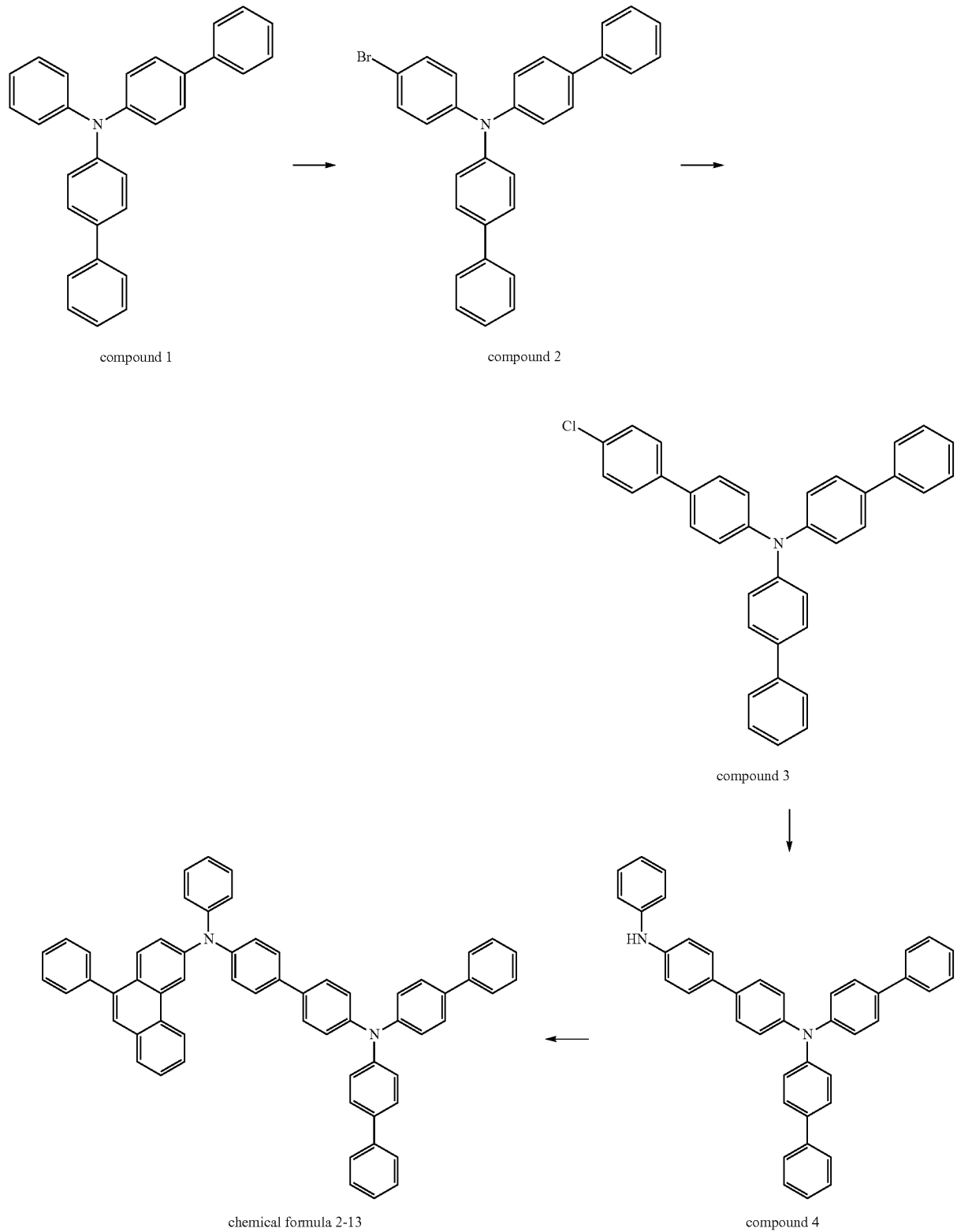 [SMILES: c1ccc(-c2ccc(N(c3ccccc3)c3ccc(-c4ccccc4)cc3)cc2)cc1 ; Brc1ccc(N(c2ccc(-c3ccccc3)cc2)c2ccc(-c3ccccc3)cc2)cc1 ; Clc1ccc(-c2ccc(N(c3ccc(-c4ccccc4)cc3)c3ccc(-c4ccccc4)cc3)cc2)cc1 ; c1ccc(-c2ccc(N(c3ccc(-c4ccccc4)cc3)c3ccc(-c4ccc(N(c5ccccc5)c5ccc6c(-c7ccccc7)cc7ccccc7c6c5)cc4)cc3)cc2)cc1 ; c1ccc(Nc2ccc(-c3ccc(N(c4ccc(-c5ccccc5)cc4)c4ccc(-c5ccccc5)cc4)cc3)cc2)cc1]

<Preparation of Compound 1>

Aniline (20 g, 214.8 mmol), 4-bromobiphenyl (110 g, 471.9 mmol), sodium tert-butoxide (53 g, 551.5 mmol), bis(tritert-butylphosphine)palladium (2.2 g, 4.3 mmol), and 1,400 ml of toluene were put into the 2 L round bottom flask, and refluxed while being agitated for 8 hours. Cooling was performed to normal temperature, and 100 g of cellite 545 was put thereinto and agitated for 30 mins. The reaction solution was filtered, and distilled under reduced pressure to be concentrated. Re-crystallization was performed by tetrahydrofuran and ethanol to obtain compound 1 (69.6 g, 175.1 mmol) at a yield of 81.5%. MS: $[M+H]^+=398$ <Preparation of Compound 2>

Compound 1 (60 g, 150.9 mmol) was dissolved in 800 ml of chloroform and N-bromosuccinimide (29 g, 162.9 mmol) was slowly put into the 1 L round bottom flask for 10 min, and agitated for 4 hours. After 100 ml of the sodium thiosulfate aqueous solution was put and agitated for 20 mins, the organic layer was separated. The separated organic layer was washed by 50 ml of the sodium chloride aqueous solution and then dried by magnesium sulfate anhydride. The solution was filtered, concentrated under reduced pressure, and re-crystallized by chloroform and ethanol to obtain compound 2 (54.4 g, 114.2 mmol) at a yield of 75.7%. MS: $[M+H]^+=477$ <Preparation of Compound 3>

Compound 2 (40 g, 84 mmol), 4-chlorophenylboronic acid (14.4 g, 92.1 mmol), potassium carbonate (46.4 g, 335.8 mmol), tetrakis(triphenylphosphine)palladium (2 g, 1.73 mmol), 400 ml of tetrahydrofuran, and 200 ml of water were put into the 1 L round bottom flask, and refluxed while being agitated for 8 hours. After cooling was performed to normal temperature, the generated solid was filtered, and sequentially washed by 400 ml of water and 400 ml of ethanol. The filtered solid was re-crystallized by tetrahydrofuran and ethanol to obtain compound 3 (27.7 g, 54.5 mmol) at a yield of 64.9%. MS: $[M+H]^+=508$ <Preparation of Compound 4>

Compound 3 (20 g, 39.4 mmol), aniline (4 g, 43 mmol), sodium tert-butoxide (4.9 g, 51 mmol), bis(tri tert-butylphosphine)palladium (0.4 g, 0.78 mmol), and 300 ml of xylene were put into the 500 ml round bottom flask, and refluxed while being agitated for 8 hours. Cooling was performed to normal temperature, and 20 g of cellite 545 was put thereinto and agitated for 30 mins. The reaction solution was filtered, and distilled under reduced pressure to be concentrated. Re-crystallization was performed by tetrahydrofuran and ethanol to obtain compound 4 (18.6 g, 32.9 mmol) at a yield of 83.7%. MS: $[M+H]^+=565$ <Preparation of the Compound of Chemical Formula 2-13>

Compound 4 (10 g, 17.7 mmol), compound 3 (5.2 g, 18 mmol) of Preparation Example 3, sodium tert-butoxide (2.21 g, 23 mmol), bis(tri tert-butylphosphine)palladium (0.18 g, 0.35 mmol), and 100 ml of xylene were put into the 250 ml round bottom flask, and refluxed while being agitated for 8 hours. Cooling was performed to normal temperature, and the generated solid was filtered. The filtered solid was subjected to column purification to obtain Chemical Formula 2-13 (9.2 g, 11.3 mmol) at a yield of 63.6%. MS: $[M+H]^+=817$ Experimental Example 1

Manufacturing of the Organic Light Emitting Device

A glass substrate (corning 7059 glass) on which a thin film of ITO (indium tin oxide) was applied to a thickness of 800 Å was immersed in distilled water having a detergent dissolved therein, and washed with ultrasonic waves. In this case, the detergent as used herein was a product commercially available from Fisher Co. and the distilled water was one which had been twice filtered by using a filter commercially available from Millipore Co. ITO was washed for 30 mins, and washing with ultrasonic waves was then repeated twice for 10 mins by using distilled water. After the completion of washing with distilled water, washing with ultrasonic waves was performed by using solvents such as isopropyl alcohol, acetone, and methanol, and the resulting product was dried and transported to the plasma washing machine. Further, the substrate was dry-washed by using the oxygen plasma for 5 mins, and then transported to the vacuum deposition machine.

Hexanitrile hexaazatriphenylene (hereinafter, referred to as "HAT") that was the compound of the following Chemical Formula was deposited under the heat vacuum in a thickness of 50 Å on the prepared ITO transparent electrode to form the thin film. The interfacial property between the substrate and the hole injection layer can be improved by the thin film. Subsequently, after NPB was deposited in a thickness of 850 Å on the thin film to form the hole transport layer, the compound of Chemical Formula 1-3 was deposited in a thickness of 350 Å thereon to form the hole transport and electron block layers. Subsequently, the light emitting layer was formed in a thickness of 250 Å by doping 10 wt % of Ir(ppy)$_3$ on CBP. BCP was formed as the hole blocking layer in a thickness of 50 Å thereon, and, subsequently, the electron transport layer material of the following Chemical Formula was deposited in a thickness of 300 Å to form the electron transport layer. Lithium fluoride (LiF) in a thickness of 12 Å and aluminum in a thickness of 2000 Å were subsequently deposited on the electron transport layer to form the cathode.

In the aforementioned process, the deposition rate of the organic material was maintained at 0.3 to 0.8 Å/sec. Further, the deposition rate of lithium fluoride of the cathode was maintained at 0.3 Å/sec, and the deposition rate of aluminum was maintained at 1.5 to 2.5 Å/sec. The degree of vacuum during the deposition was maintained at 1 to $3\times10^{-7}$.

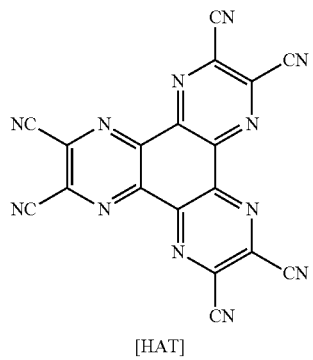

[HAT]

-continued

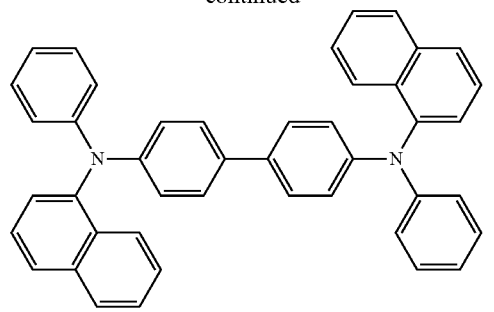

[Ir(ppy)3]

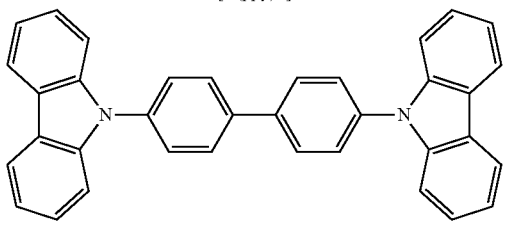

[BCP]

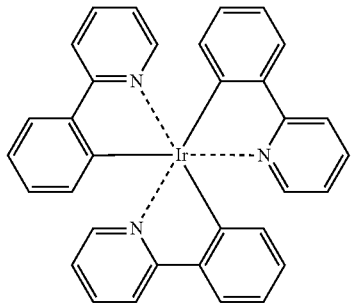

[Electron transport layer material]

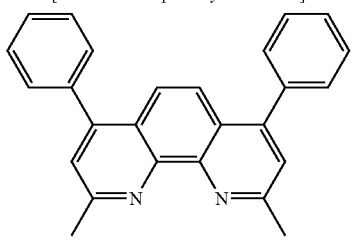

In the manufactured device, the electric field was 5.75 V at the positive direction current density of 10 mA/cm², and the spectrum having current efficiency of 58.8 cd/A was observed. As described above, the aforementioned current efficiency of the device means that the compound of Chemical Formula 1-3 serves to transport holes and block electrons together.

Experimental Example 2

Manufacturing of the Organic Light Emitting Device

The same device was manufactured, except that the compound of Chemical Formula 1-3 used as the hole transport and electron blocking layer in Example 1 was substituted by the compound of Chemical Formula 1-4.

In the manufactured device, the electric field was 5.51 V at the positive direction current density of 10 mA/cm², and the spectrum having current efficiency of 58.2 cd/A was observed.

Experimental Example 3

Manufacturing of the Organic Light Emitting Device

The same device was manufactured, except that the compound of Chemical Formula 1-3 used as the hole transport and electron blocking layer in Example 1 was substituted by the compound of Chemical Formula 1-7.

In the manufactured device, the electric field was 5.71 V at the positive direction current density of 10 mA/cm², and the spectrum having current efficiency of 59.1 cd/A was observed.

Experimental Example 4

Manufacturing of the Organic Light Emitting Device

The same device was manufactured, except that the compound of Chemical Formula 1-3 used as the hole transport and electron blocking layer in Example 1 was substituted by the compound of Chemical Formula 1-8.

In the manufactured device, the electric field was 5.54 V at the positive direction current density of 10 mA/cm², and the spectrum having current efficiency of 57.9 cd/A was observed.

Comparative Example

Manufacturing of the Organic Light Emitting Device

The same device was manufactured, except that the compound of Chemical Formula 1-3 used as the hole transport and electron blocking layer in Example 1 was substituted by the following Chemical Formula HT1.

In the manufactured device, the electric field was 5.41 V at the positive direction current density of 10 mA/cm², and the spectrum having current efficiency of 50.8 cd/A was observed.

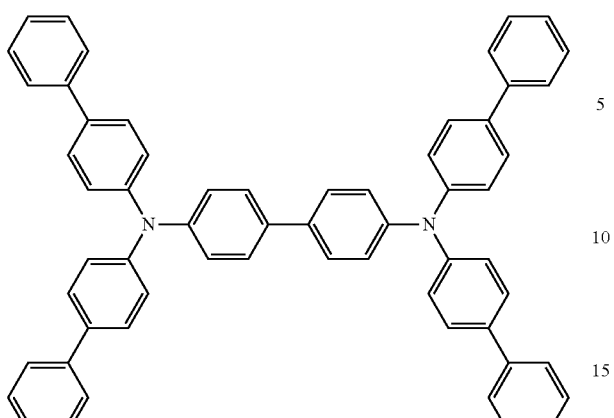

[HT1]

In the case of the device manufactured by using the compound represented by Chemical Formula 1 of the invention of the present application, it can be confirmed that high current efficiency is exhibited, and this is because the compound of Chemical Formula 1 serves to transport holes and block electrons together in the device.

The invention claimed is:

1. A compound represented by the following Chemical Formula 1:

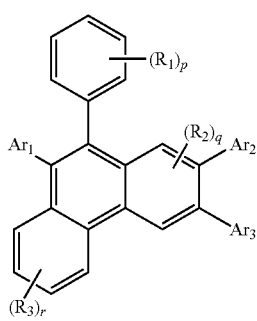

[Chemical Formula 1]

wherein, $Ar_1$ is hydrogen;

$Ar_2$ and $Ar_3$ are the same as or different from each other, and are each independently selected from the group consisting of hydrogen; an alkyl group unsubstituted or substituted by one or more substituent groups selected from the group consisting of a halogen group, an alkyl group, an alkenyl group, an alkoxy group, a cycloalkyl group, an aryl group, an arylalkyl group, an arylalkenyl group, a heterocyclic group, a nitrile group, and an acetylene group; an alkoxy group unsubstituted or substituted by one or more substituent groups selected from the group consisting of a halogen group, an alkyl group, an alkenyl group, an alkoxy group, a cycloalkyl group, an aryl group, an arylalkyl group, an arylalkenyl group, a heterocyclic group, a nitrile group, and an acetylene group; an aryl group unsubstituted or substituted by one or more substituent groups selected from the group consisting of a halogen group, an alkyl group, an alkenyl group, an alkoxy group, a cycloalkyl group, an aryl group, an arylalkyl group, an arylalkenyl group, a heterocyclic group, a nitrile group, an acetylene group, and an arylamine group; a heterocyclic group unsubstituted or substituted by one or more substituent groups selected from the group consisting of a halogen group, an alkyl group, an alkenyl group, an alkoxy group, a cycloalkyl group, an aryl group, an arylalkyl group, an arylalkenyl group, a heterocyclic group, a nitrile group, and an acetylene group; and an amine group unsubstituted or substituted by one or more substituent groups selected from the group consisting of an alkyl group, an alkenyl group, an aryl group, an arylalkyl group, an arylalkenyl group, and a heterocyclic group, at least one of $Ar_2$ and $Ar_3$ is an amine group unsubstituted or substituted by a phenyl group, a biphenyl group, a terphenyl group, stilben, a naphthyl group, an anthracenyl group, a pyrenyl group, a perylenyl group, a chrysenyl group, a heterocyclic group, or a fluorenyl group; or an aryl group substituted by an amine group unsubstituted or substituted by an aryl group, a heterocyclic group, or a fluorenyl group, and may be further substituted by an aryl group, a fluorene group, or an amine group substituted by a substituent selected from the group consisting of an aryl group and a heterocyclic group, $R_1$ and $R_2$ are the same as or different from each other, and are each independently selected from the group consisting of hydrogen; a halogen group; an alkyl group; an alkenyl group; an alkoxy group; and a heterocyclic group, $R_3$ is selected from the group consisting of hydrogen; a halogen group; an alkyl group; an alkenyl group; an alkoxy group; and a heterocyclic group, and p is an integer of 1 to 5, q is an integer of 1 or 2, and r is an integer of 1 to 4.

2. The compound of claim 1, wherein Chemical Formula 1 is represented by the following Chemical Formulas 2 to 5:

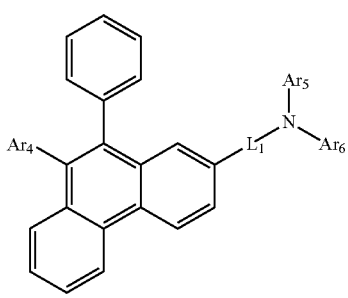

[Chemical Formula 2]

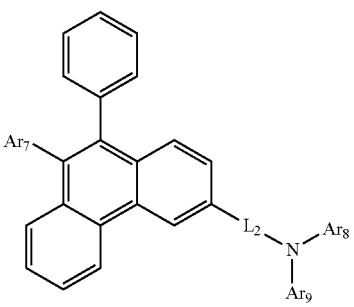

[Chemical Formula 3]

-continued

[Chemical Formula 4]

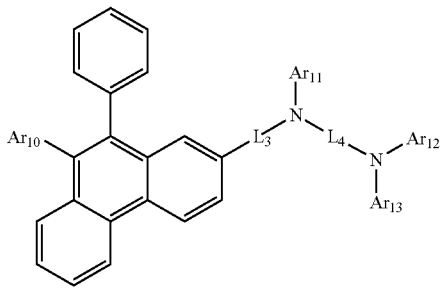

[Chemical Formula 5]

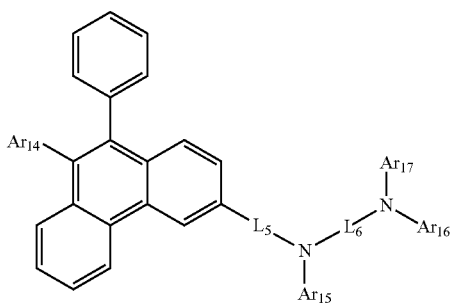

wherein,

Ar$_4$, Ar$_7$, Ar$_{10}$, and Ar$_{14}$ are hydrogen,

Ar$_5$, Ar$_6$, Ar$_8$, Ar$_9$, Ar$_{11}$, Ar$_{12}$, Ar$_{13}$, Ar$_{15}$, Ar$_{16}$, and Ar$_{17}$ are each independently a substituted or unsubstituted aryl group, a substituted or unsubstituted heterocyclic group, or a substituted or unsubstituted fluorenyl group, L$_1$, L$_2$, L$_3$ and L$_5$ are a direct bond, an arylene group, or a fluorenylene group, and L$_4$ and L$_6$ are an arylene group, when L$_1$ is direct bond, Ar$_5$ and Ar$_6$ are each independently a substituted or unsubstituted phenyl group, a substituted or unsubstituted biphenyl group, a substituted or unsubstituted terphenyl group, a substituted or unsubstituted stilben, a substituted or unsubstituted naphthyl group, a substituted or unsubstituted anthracenyl group, a substituted or unsubstituted pyrenyl group, a substituted or unsubstituted perylenyl group, a substituted or unsubstituted chrysenyl group, a substituted or unsubstituted heterocyclic group, or a substituted or unsubstituted fluorenyl group, when L$_2$ is direct bond, Ar$_8$ and Ar$_9$ are each independently a substituted or unsubstituted phenyl group, a substituted or unsubstituted biphenyl group, a substituted or unsubstituted terphenyl group, a substituted or unsubstituted stilben, a substituted or unsubstituted naphthyl group, a substituted or unsubstituted anthracenyl group, a substituted or unsubstituted pyrenyl group, a substituted or unsubstituted perylenyl group, a substituted or unsubstituted chrysenyl group, a substituted or unsubstituted heterocyclic group, or a substituted or unsubstituted fluorenyl group, when L$_3$ is direct bond, Ar$_{11}$ is a substituted or unsubstituted phenyl group, a substituted or unsubstituted biphenyl group, a substituted or unsubstituted terphenyl group, a substituted or unsubstituted stilben, a substituted or unsubstituted naphthyl group, a substituted or unsubstituted anthracenyl group, a substituted or unsubstituted pyrenyl group, a substituted or unsubstituted perylenyl group, a substituted or unsubstituted chrysenyl group, a substituted or unsubstituted heterocyclic group, or a substituted or unsubstituted fluorenyl group, and when L$_4$ is direct bond, Ar$_{15}$ is a substituted or unsubstituted phenyl group, a substituted or unsubstituted biphenyl group, a substituted or unsubstituted terphenyl group, a substituted or unsubstituted stilben, a substituted or unsubstituted naphthyl group, a substituted or unsubstituted anthracenyl group, a substituted or unsubstituted pyrenyl group, a substituted or unsubstituted perylenyl group, a substituted or unsubstituted chrysenyl group, a substituted or unsubstituted heterocyclic group, or a substituted or unsubstituted fluorenyl group.

3. The compound of claim 1, wherein at least one of Ar$_2$ and Ar$_3$ of Chemical Formula 1 is an amine group unsubstituted or substituted by a phenyl group, a biphenyl group, a terphenyl group, a phenyl group substituted by a fluorenyl group, a naphthyl group, a fluorenyl group substituted by an alkyl group, or a dibenzothiophenyl group.

4. The compound of claim 1, wherein at least one of Ar$_2$ and Ar$_3$ of Chemical Formula 1 is a phenyl group substituted by an amine group unsubstituted or substituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group; a biphenyl group substituted by an amine group unsubstituted or substituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group; a fluorenyl group substituted by an amine group unsubstituted or substituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group; or a naphthyl group substituted by an amine group unsubstituted or substituted by a phenyl group, a biphenyl group, a terphenyl group, a phenyl group substituted by a fluorenyl group, a naphthyl group, a fluorenyl group substituted by an alkyl group, a dibenzothiophenyl group, or a phenanthrenyl group.

5. The compound of claim 1, wherein at least one of Ar$_2$ and Ar$_3$ of Chemical Formula 1 is the following substituent group

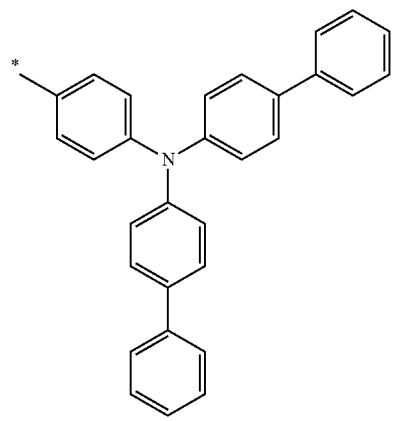

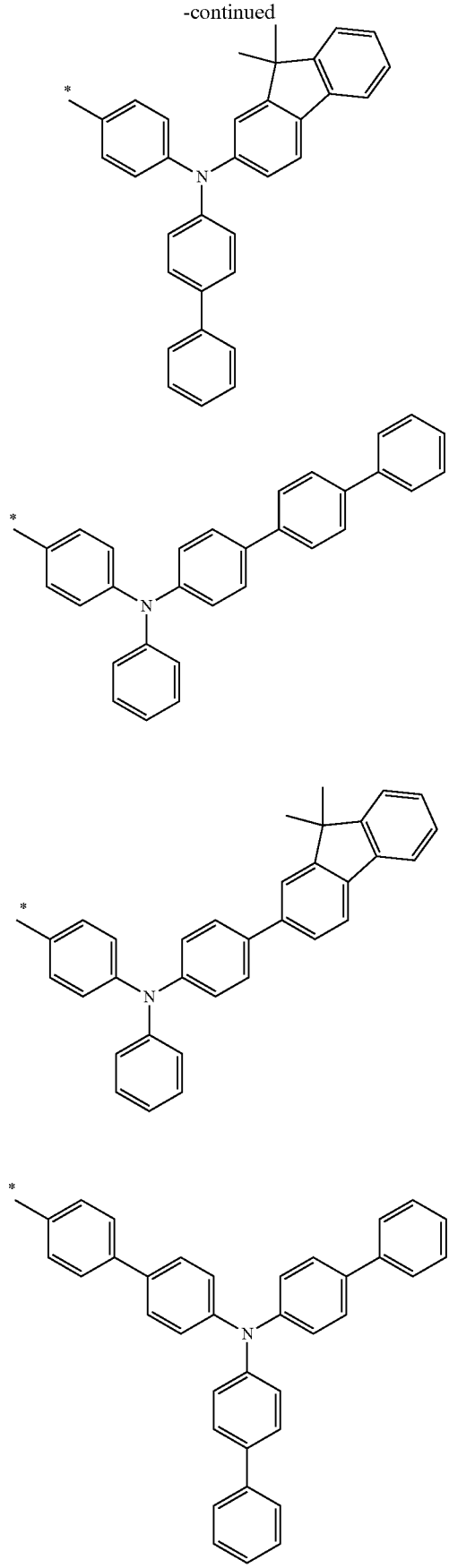

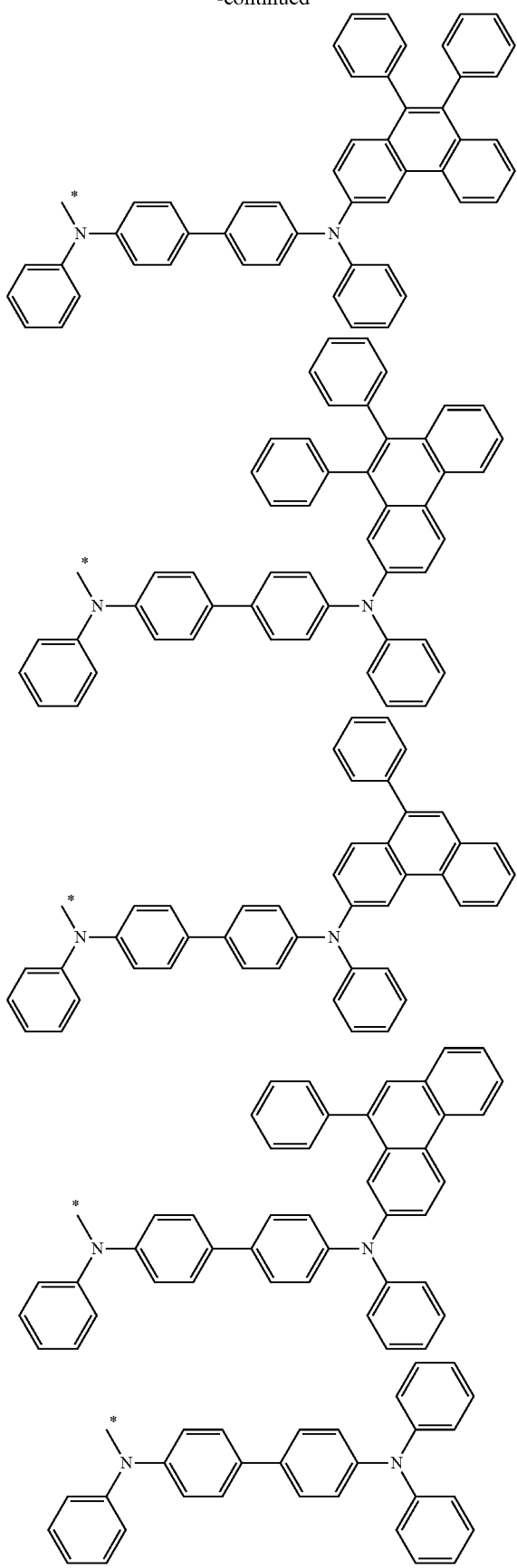
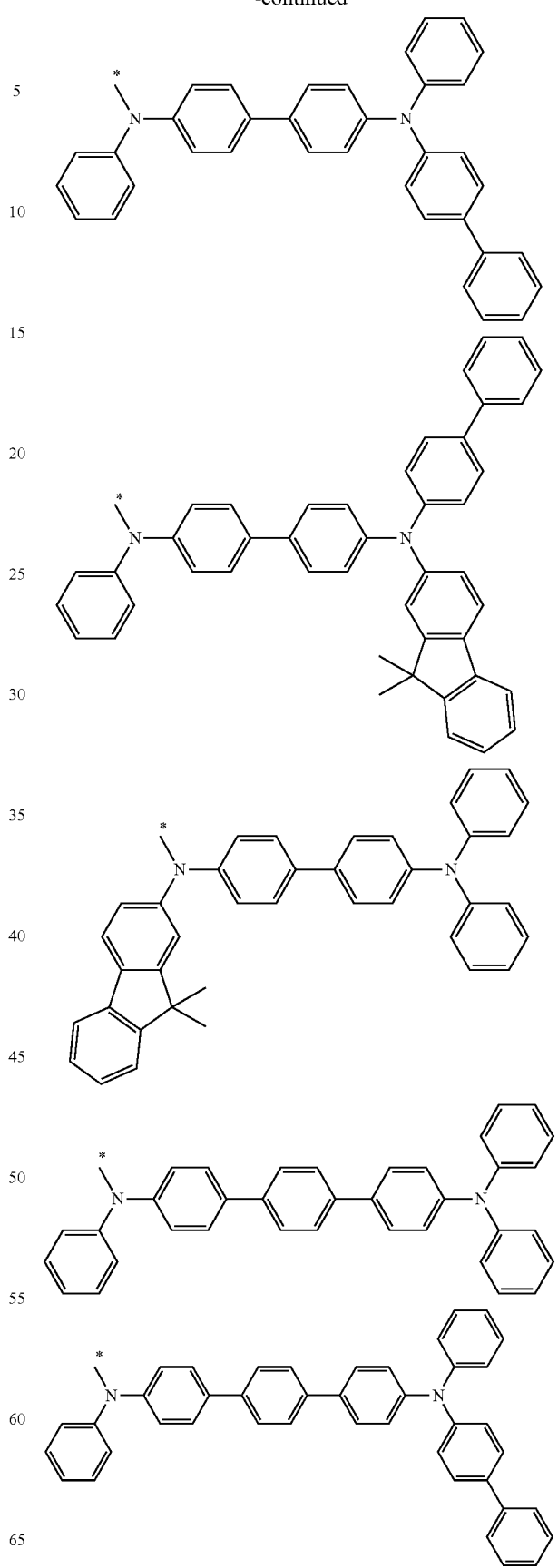

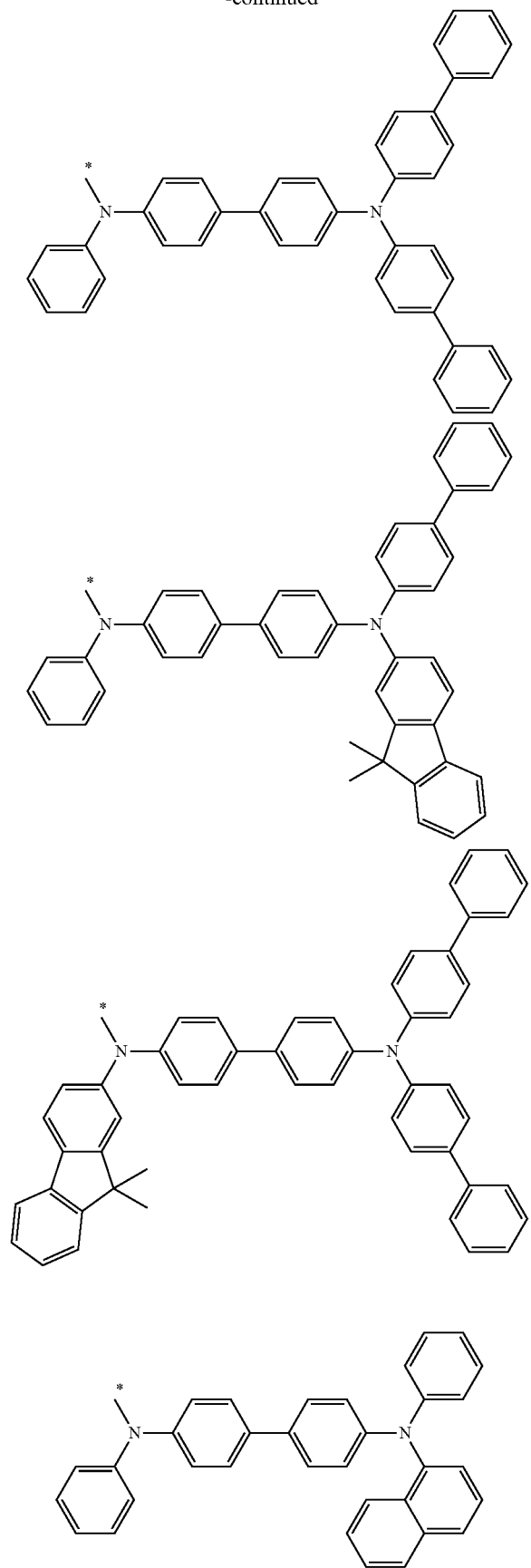
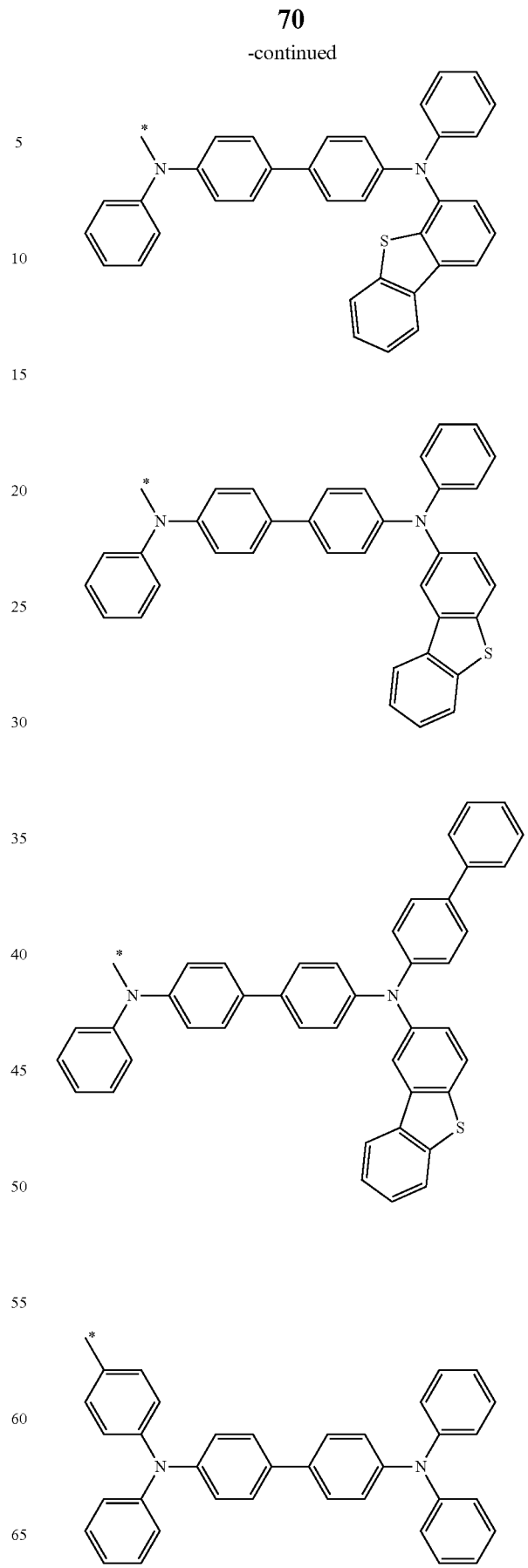

-continued

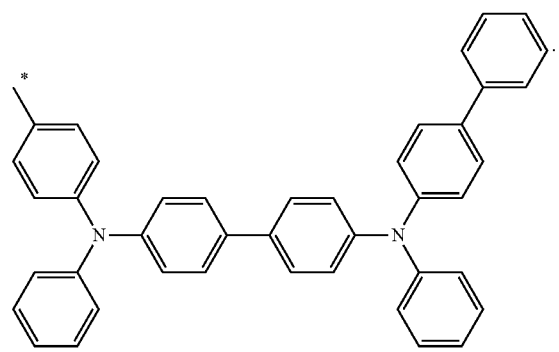

6. The compound of claim 2, wherein $Ar_5$, $Ar_6$, $Ar_8$, $Ar_9$, $Ar_{11}$, $Ar_{12}$, $Ar_{13}$, $Ar_{15}$, $Ar_{16}$, and $Ar_{17}$ of Chemical Formulas 2 to 5 are each independently a phenyl group, a biphenyl group, a terphenyl group, a phenyl group substituted by a fluorenyl group, a naphthyl group, a fluorenyl group substituted by an alkyl group, or a dibenzothiophenyl group.

7. The compound of claim 2, wherein $L_1$, $L_2$, $L_3$, and $L_5$ of Chemical Formulas 2 to 5 are each independently a direct bond, a phenylene group, a biphenylene group, a naphthylene group, or a fluorenylene group.

8. The compound of claim 2, wherein $L_4$ and $L_6$ of Chemical Formulas 2 to 5 are each independently a biphenylene group or a terphenylene group.

9. The compound of claim 1, wherein the compound represented by Chemical Formula 1 is selected from the group consisting of the following compounds:

chemical formula 1-3

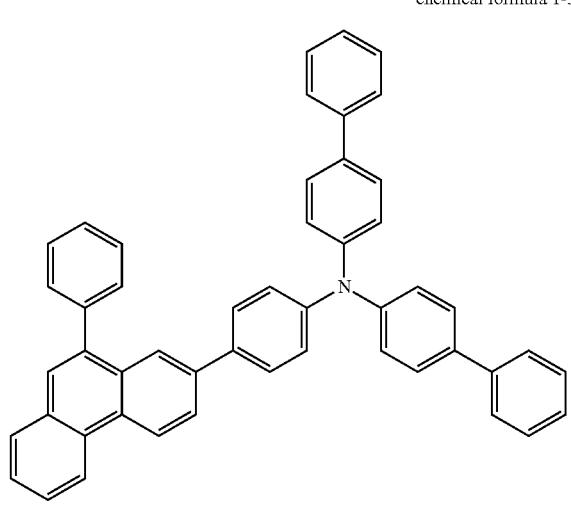

chemical formula 1-4

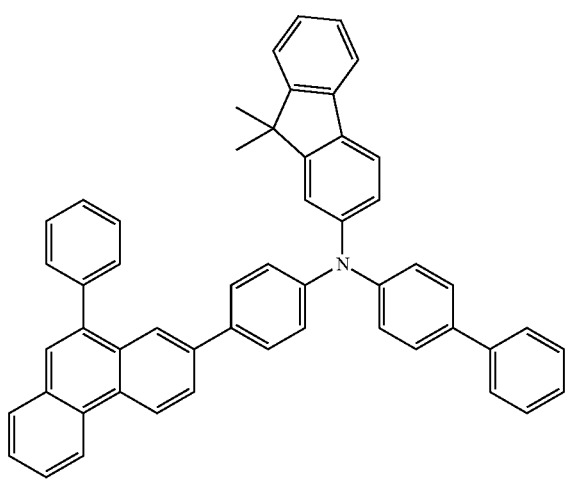

chemical formula 1-7

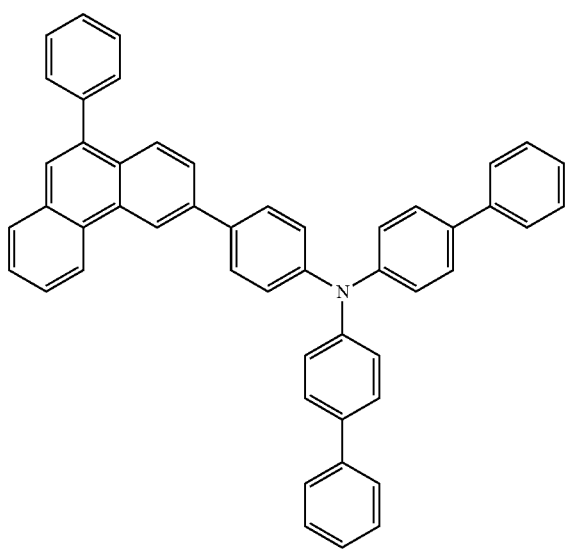

chemical formula 1-8 chemical formula 1-9
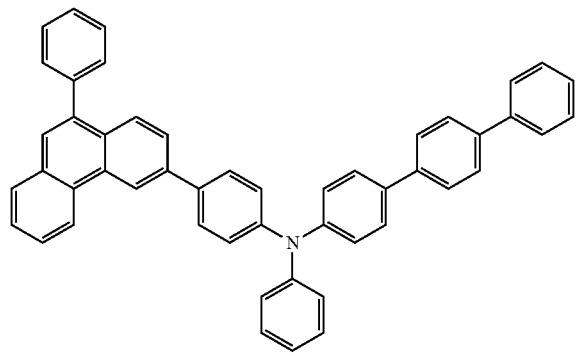
chemical formula 1-10
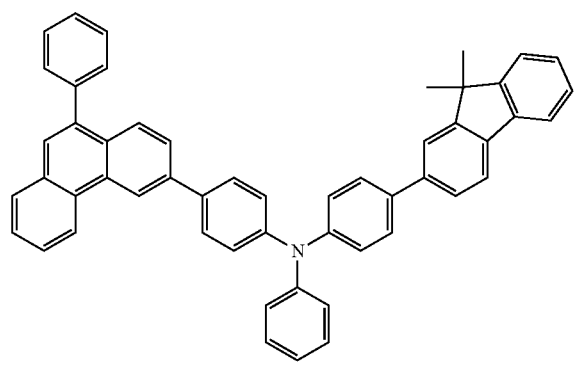
chemical formula 1-11
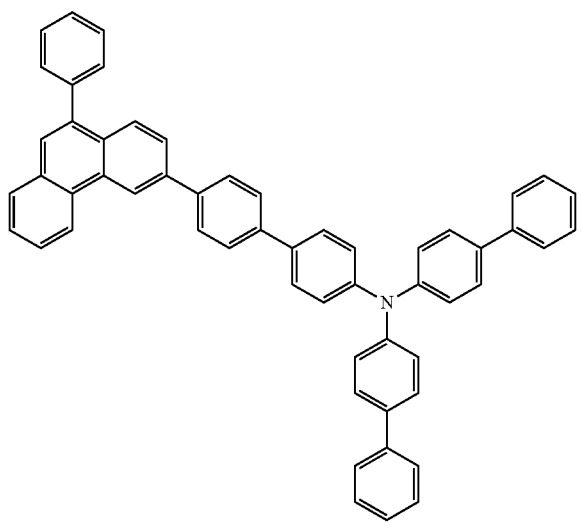
chemical formula 1-12
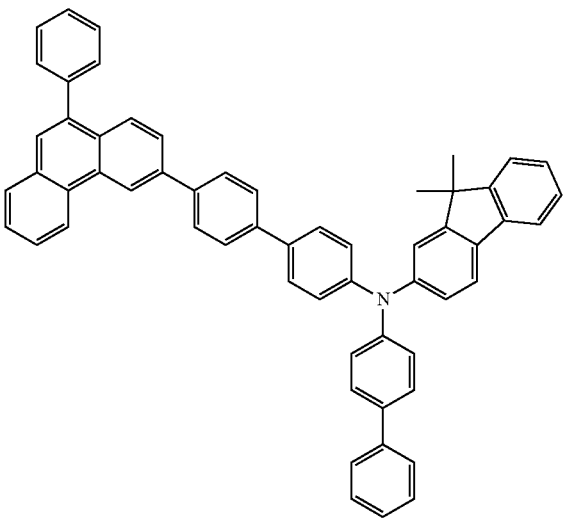
chemical formula 1-13
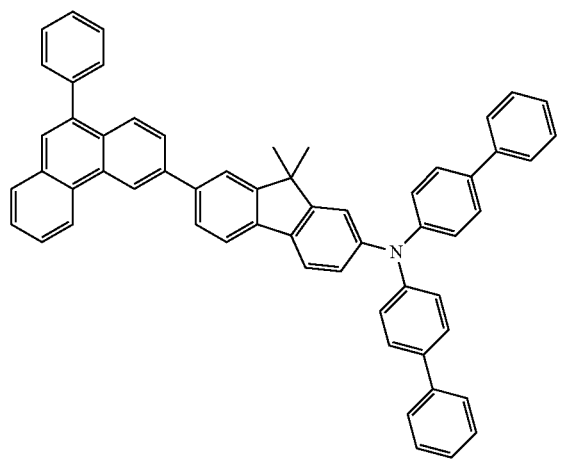
chemical formula 1-14
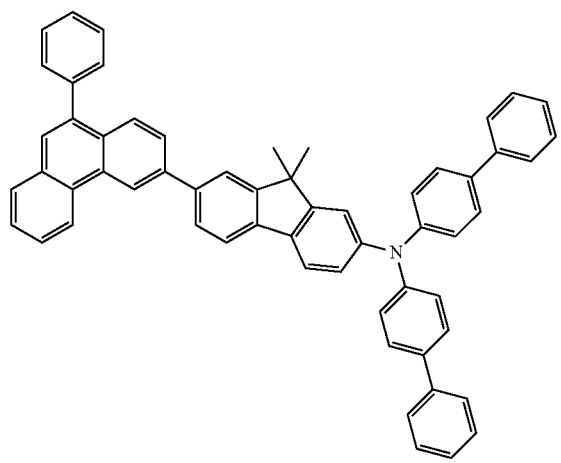

-continued
chemical formula 1-15
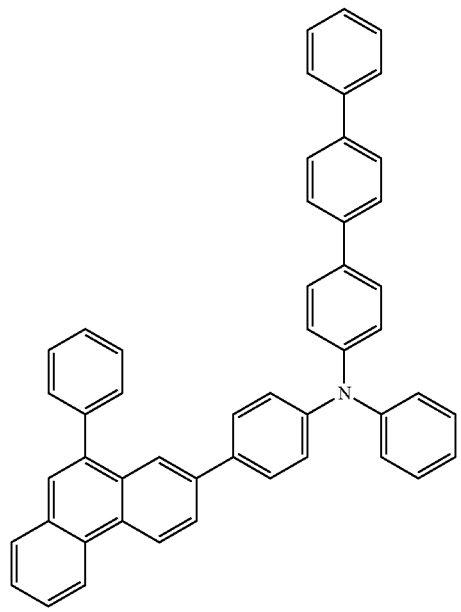
chemical formula 1-16
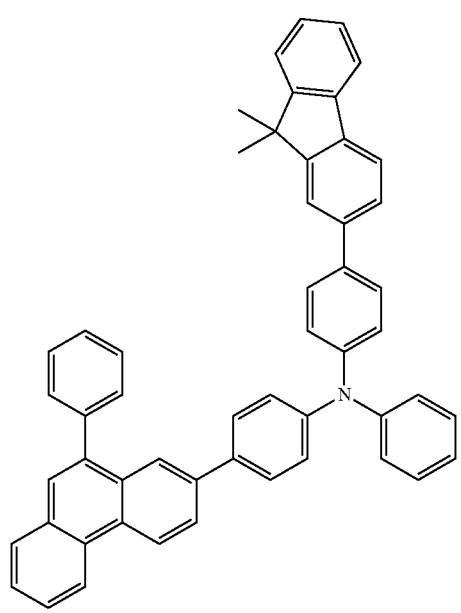
-continued
chemical formula 1-17
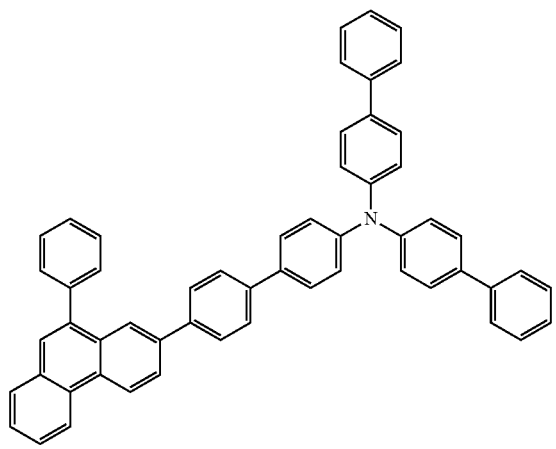
chemical formula 1-18
chemical formula 1-19
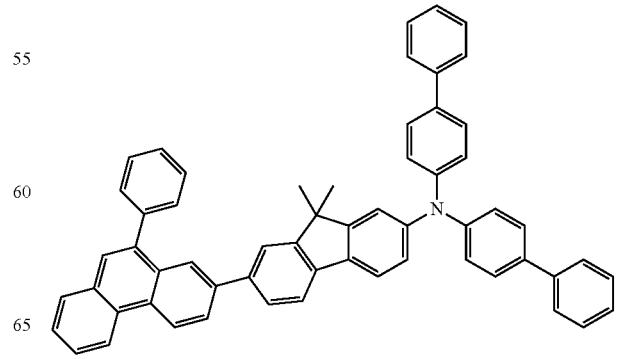

chemical formula 1-20
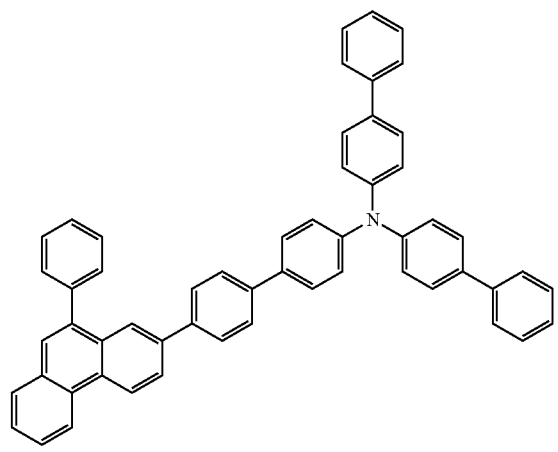
chemical formula 1-21
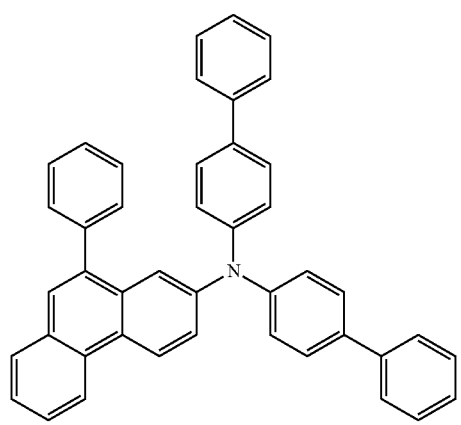
chemical formula 1-22
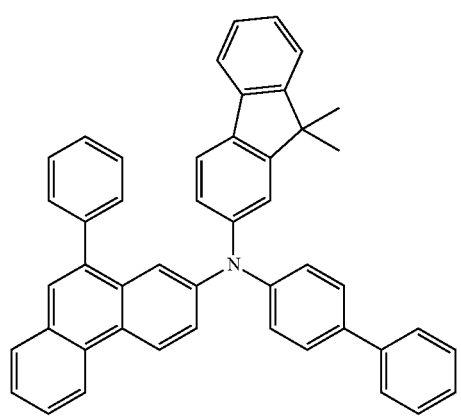
chemical formula 1-23
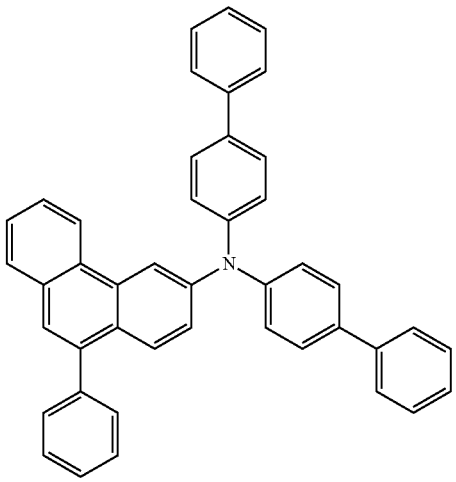
chemical formula 1-24
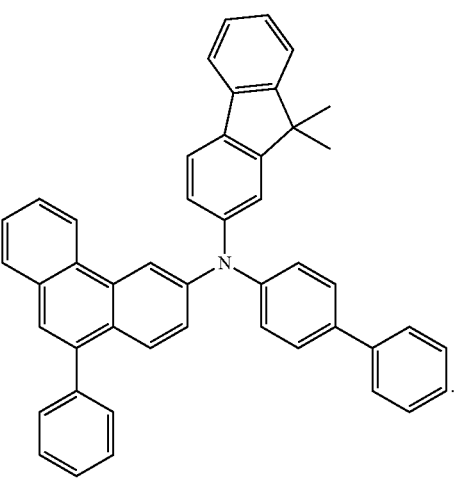
10. The compound of claim 1, wherein the compound represented by Chemical Formula 1 is selected from the group consisting of the following compounds:

chemical formula 2-3
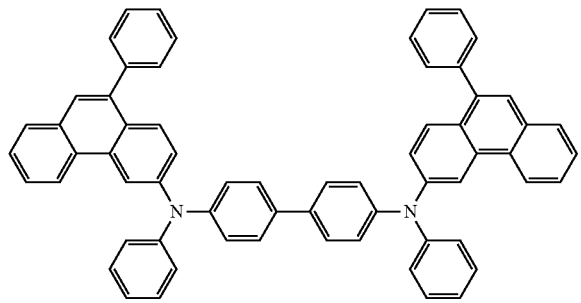
chemical formula 2-4
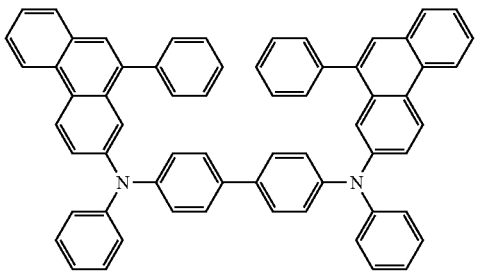
chemical formula 2-5
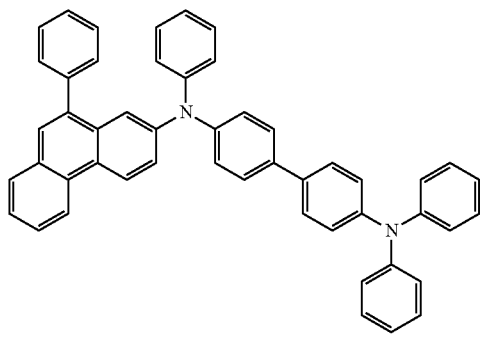
chemical formula 2-6
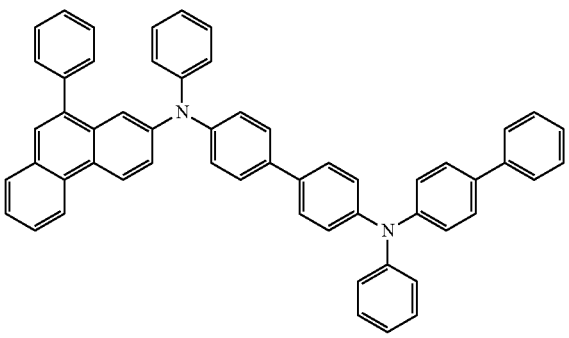
chemical formula 2-7
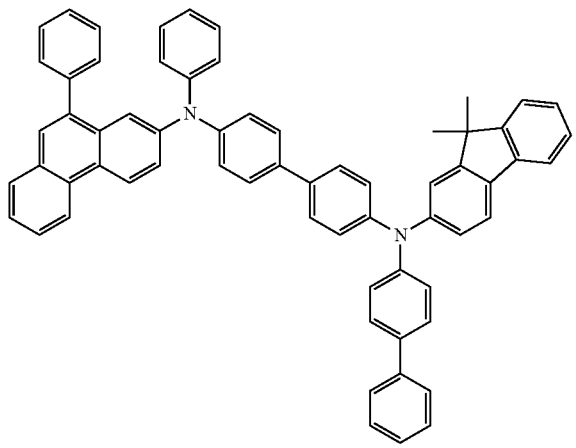
chemical formula 2-8
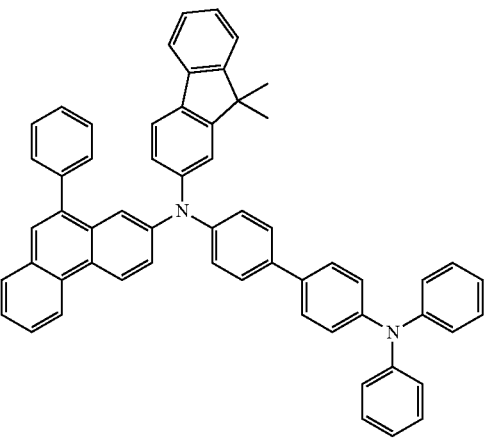
chemical formula 2-9
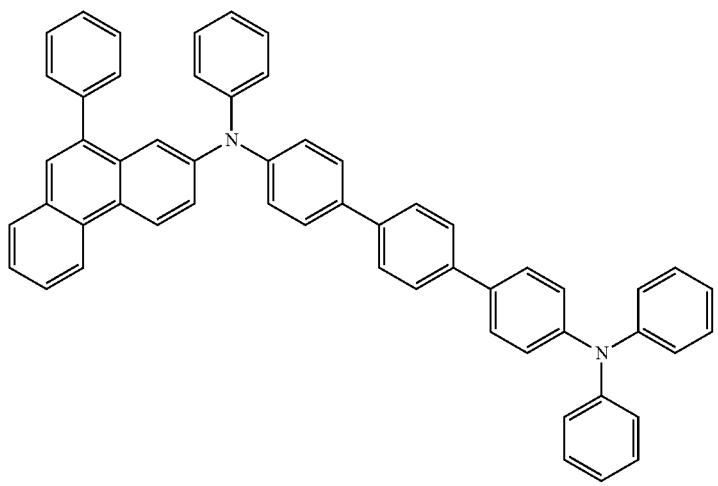

chemical formula 2-10
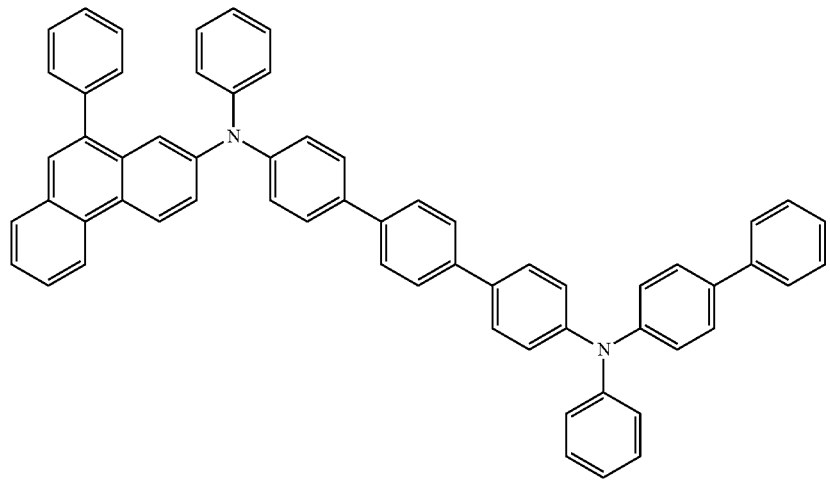
chemical formula 2-11
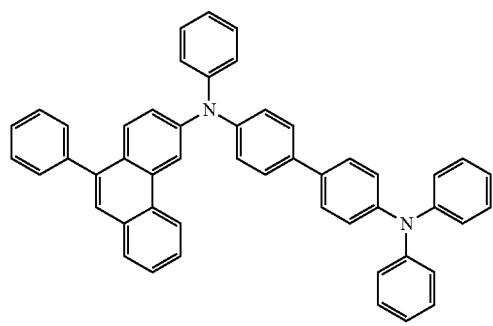
chemical formula 2-12
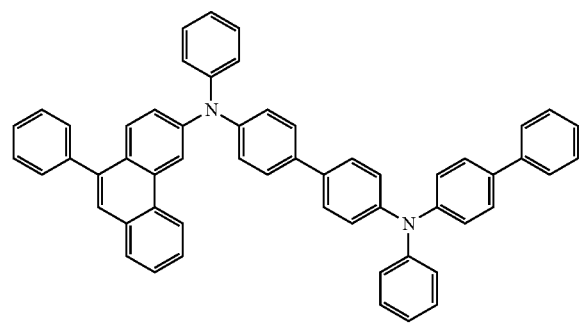
chemical formula 2-13
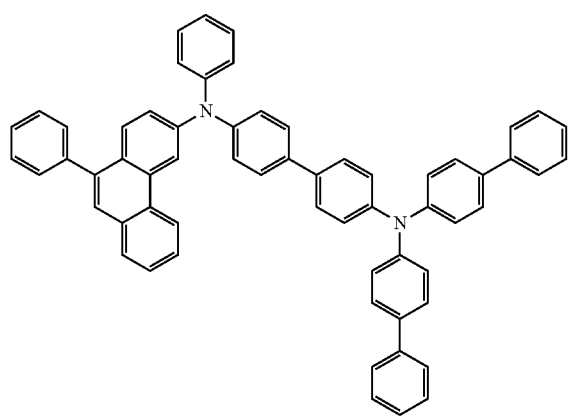
chemical formula 2-14
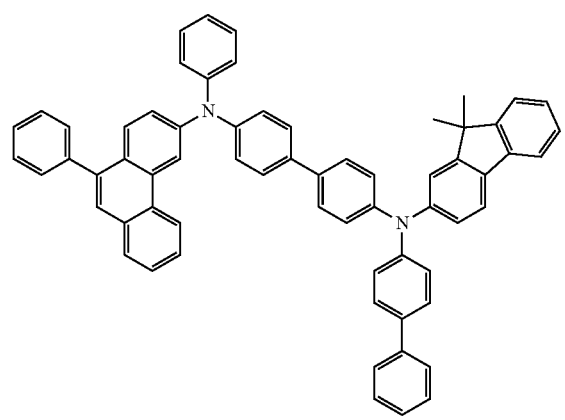

chemical formula 2-15
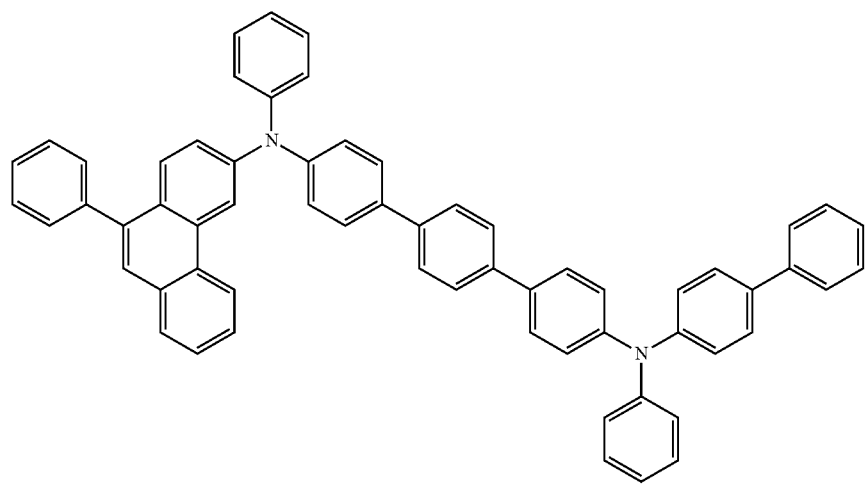
chemical formula 2-16
chemical formula 2-17
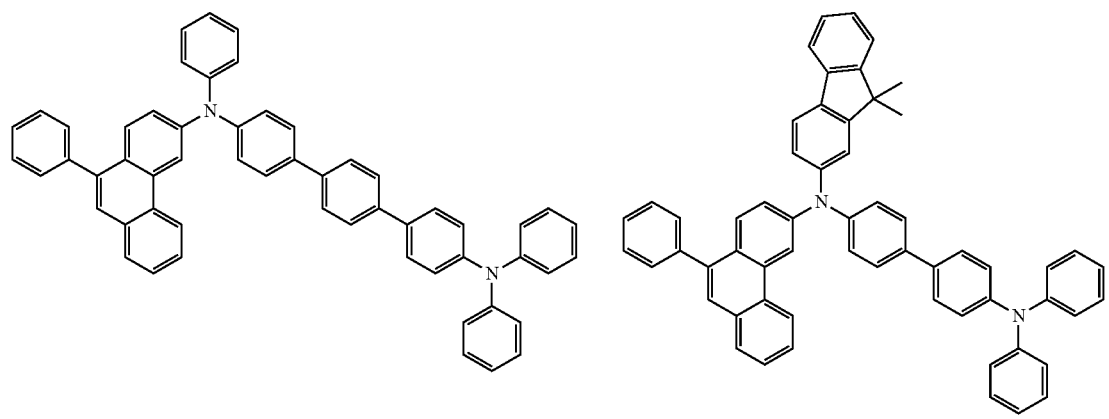
chemical formula 2-18
chemical formula 2-19
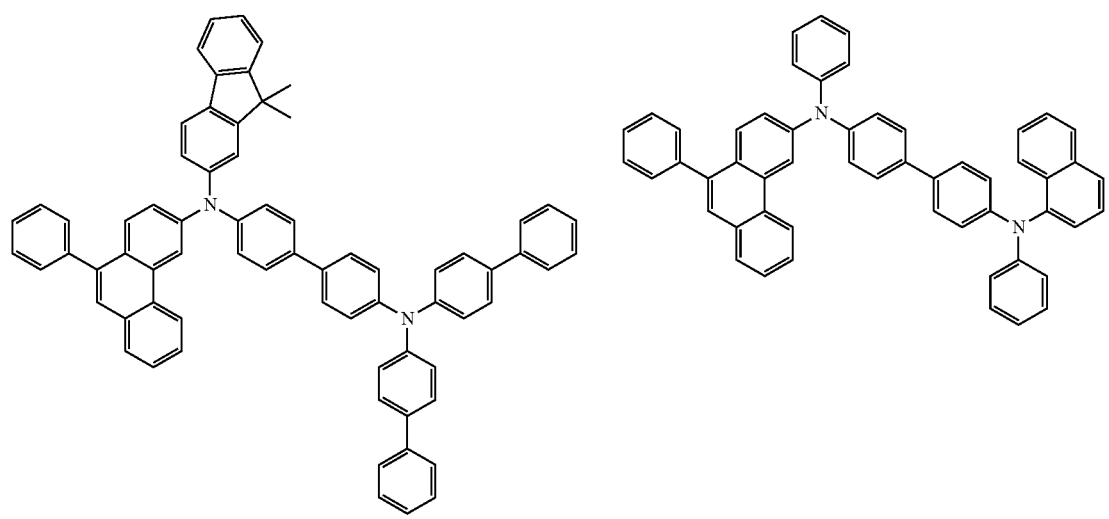

chemical formula 2-20
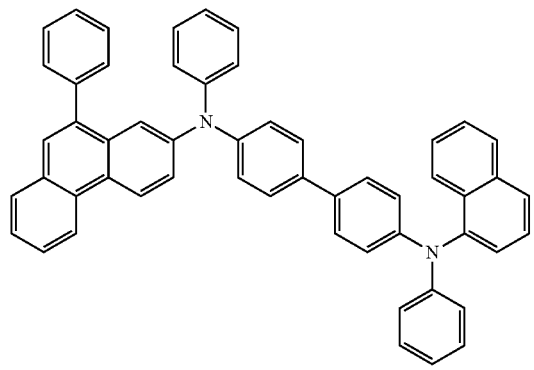
chemical formula 2-21
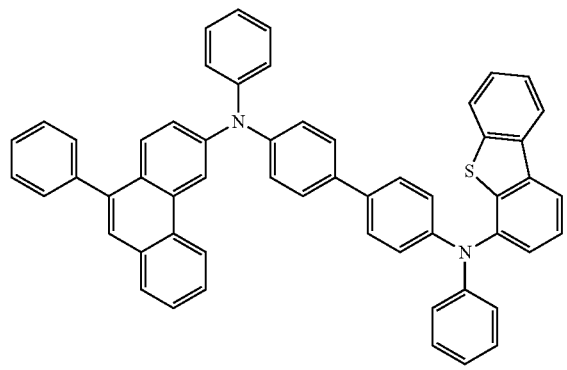
chemical formula 2-22
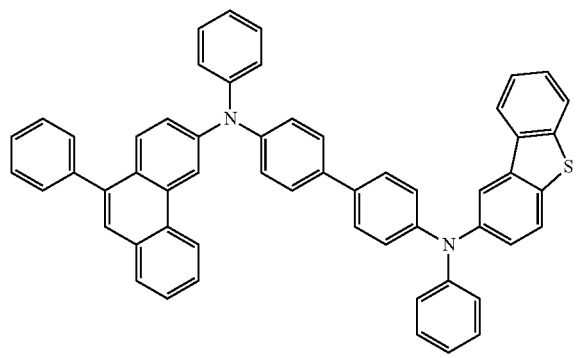
chemical formula 2-23
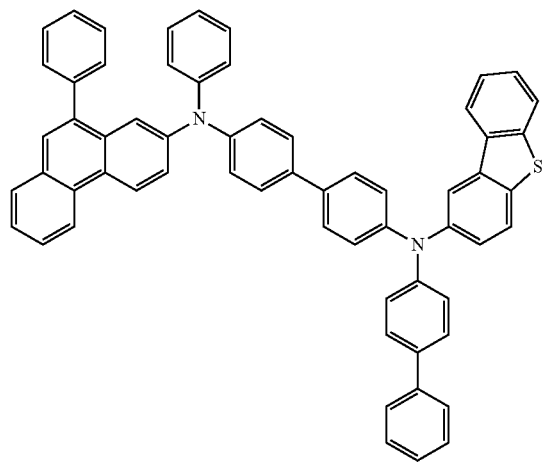
chemical formula 2-24
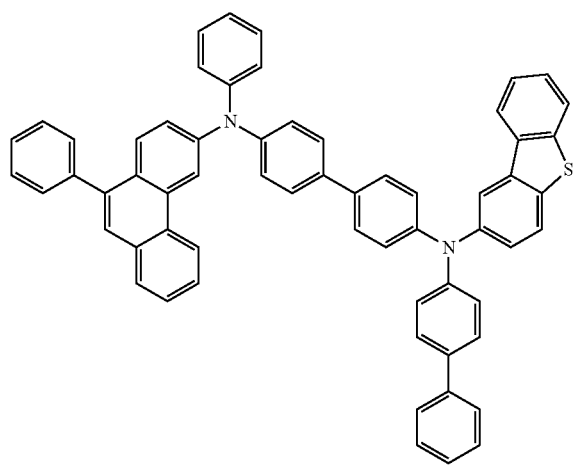
chemical formula 2-25
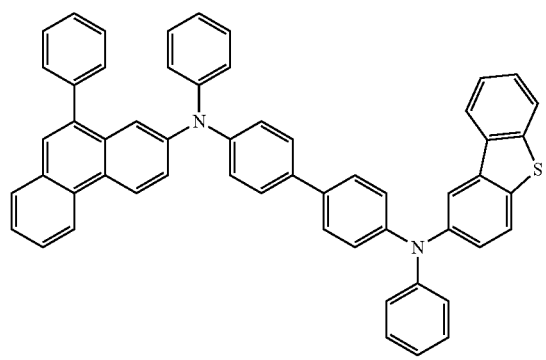

-continued chemical formula 2-26

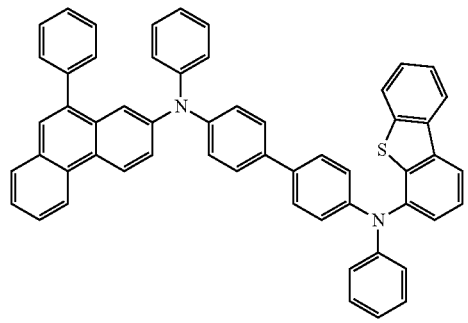

chemical formula 2-27

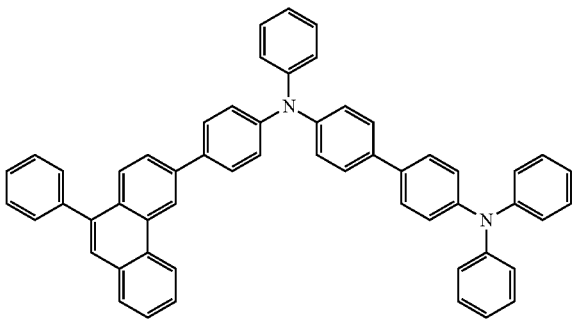

chemical formula 2-28

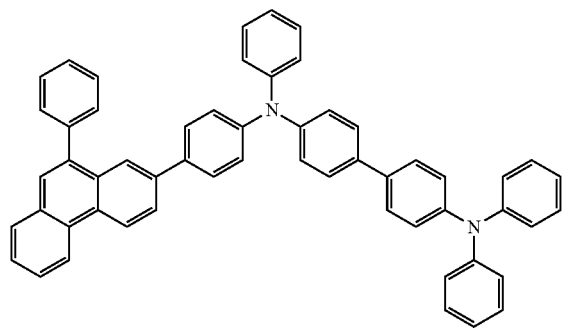

chemical formula 2-29

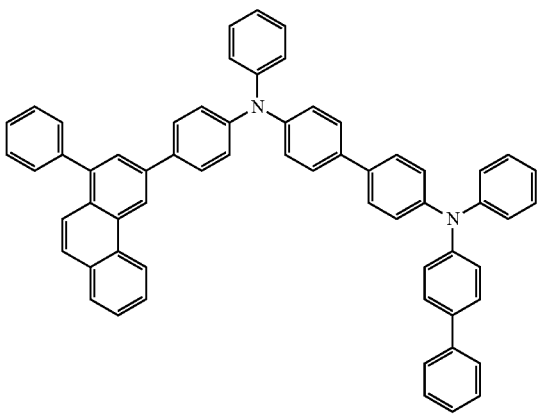

chemical formula 2-30

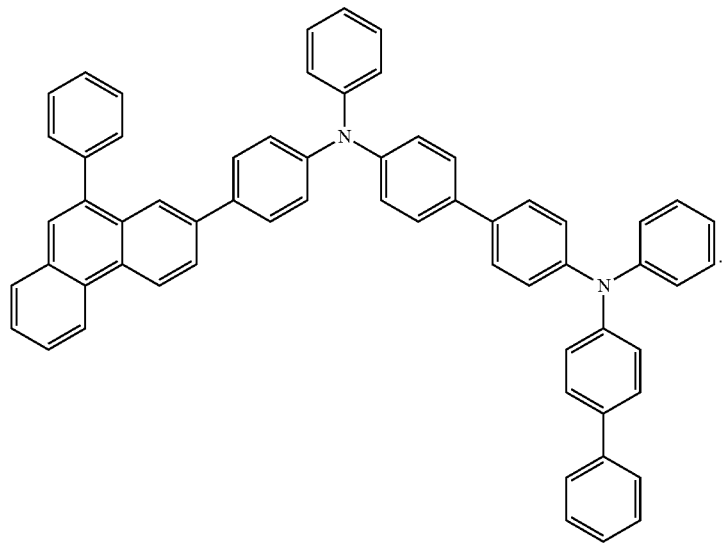

11. An organic light emitting device comprising a first electrode, a second electrode, and one or more organic material layers disposed between the first electrode and the second electrode, wherein one or more layers of the organic material layers comprise the compound according to claim 1.

12. The organic light emitting device of claim 11, wherein the organic material layer comprises one or more layers of a hole injection layer, a hole transport layer, and a layer injecting and transporting holes simultaneously, and one or more layers of the layers comprise a compound represented by Chemical Formula 1.

13. The organic light emitting device of claim 11, wherein the organic material layer comprises a light emitting layer, and the light emitting layer comprises the compound represented by Chemical Formula 1.

14. The organic light emitting device of claim 11, wherein the organic material layer comprises a hole transport layer, and the hole transport layer comprises the compound represented by Chemical Formula 1.

15. The organic light emitting device of claim 11, wherein the organic material layer comprises one or more layers of an electron transport layer, an electron injection layer, and a layer transporting and injecting electrons simultaneously, and one or more layers of the layers comprise the compound represented by Chemical Formula 1.

16. The organic light emitting device of claim 11, wherein the organic light emitting device is a top emission type, a bottom emission type, or a both-sided emission type.

\* \* \* \* \*